US012757546B2

(12) United States Patent
Liu et al.

(10) Patent No.: US 12,757,546 B2
(45) Date of Patent: Oct. 6, 2026

(54) LIGHT-EMITTING PANEL, DISPLAY DEVICE, AND BACKLIGHT MODULE

(71) Applicant: Xiamen Tianma Microelectronics Co., Ltd., Xiamen (CN)

(72) Inventors: Jian Liu, Xiamen (CN); Liu Wang, Xiamen (CN); Zhijie Wang, Xiamen (CN); Shumao Wu, Xiamen (CN); Wei Wu, Xiamen (CN); Guochang Lai, Xiamen (CN)

(73) Assignee: Xiamen Tianma Microelectronics Co., Ltd., Xiamen (CN)

( * ) Notice: Subject to any disclaimer, the term of this patent is extended or adjusted under 35 U.S.C. 154(b) by 645 days.

(21) Appl. No.: 18/128,083

(22) Filed: Mar. 29, 2023

(65) Prior Publication Data

US 2023/0246152 A1 Aug. 3, 2023

(30) Foreign Application Priority Data

Oct. 24, 2022 (CN) ......................... 202211305857.5

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC ............... H10H 20/857; G09G 3/3426; G09G 2300/0426; G09G 3/32; H01L 25/0753; H01L 25/167; G09F 9/33
See application file for complete search history.

(56) References Cited

U.S. PATENT DOCUMENTS

2017/0084588 A1* 3/2017 Wu .................... H10H 20/8506
2021/0265330 A1* 8/2021 Bibl ........................ G06F 3/042
2023/0223388 A1* 7/2023 Chung ..................... G09G 3/32 257/89
2023/0351946 A1* 11/2023 Han ....................... H10D 86/00

FOREIGN PATENT DOCUMENTS

CN 112242385 A 1/2021
CN 113745211 A 12/2021
CN 113809063 A 12/2021

* cited by examiner

*Primary Examiner* — Ismail A Muse
(74) *Attorney, Agent, or Firm* — KDW Firm PLLC

(57) ABSTRACT

A light-emitting panel includes a substrate including a first surface and a second surface opposite to each other, light-emitting elements disposed on the first surface, driver chips, at least one of the driver chips disposed on the second surface, and first connection vias penetrating through the substrate. At least one of the driver chips is electrically connected to a respective one of the light-emitting elements through a respective one of the first connection vias. In the technical solutions, at least part of the driver chips are disposed on the second surface of the substrate, that is, at least part of the driver chips are disposed on a different substrate surface from the light-emitting elements. Thus, the driver chips are effectively prevented from interfering with the light-emitting effect of the light-emitting elements, and more space can be provided for disposing light-emitting elements, thereby ensuring the light-emitting effect of the light-emitting panel.

16 Claims, 14 Drawing Sheets

LIGHT-EMITTING PANEL, DISPLAY DEVICE, AND BACKLIGHT MODULE

CROSS-REFERENCE TO RELATED APPLICATION(S)

This application claims priority to Chinese Patent Application No. 202211305857.5 filed Oct. 24, 2022, the disclosure of which is incorporated herein by reference in its entirety.

TECHNICAL FIELD

The present disclosure relates to the field of display technology and, in particular, to a light-emitting panel, a display device, and a backlight module.

BACKGROUND

With the development of display technology, the requirements of a user for the display quality of a display panel are getting increasingly higher. To satisfy the requirements of the user for the display quality of the display panel, the size of a light-emitting element in the display panel is becoming smaller, and the number of light-emitting elements included in the display panel is getting larger.

Based on changes in the size and number of light-emitting elements, there are challenges in improving the resolution of the display panel and making the display panel have a richer and more delicate display image.

SUMMARY

Embodiments of the present disclosure provide a light-emitting panel, a display device, and a backlight module. Light-emitting elements and at least one of driver chips are disposed on the surfaces of two sides of a substrate.

Embodiments of the present disclosure provide a light-emitting panel. The light-emitting panel includes a substrate, light-emitting elements, driver chips, and first connection vias. The substrate includes a first surface and a second surface disposed opposite to each other. The light-emitting elements are disposed on the first surface, and at least one of the driver chips is disposed on the second surface. The first connection vias penetrate the substrate. At least one of the driver chips is electrically connected to a respective one of the light-emitting elements through a respective one of the first connection vias.

Embodiments of the present disclosure provide a display device. The device includes a light-emitting panel, and the light-emitting panel includes a substrate, light-emitting elements, driver chips, and first connection vias. The substrate includes a first surface and a second surface disposed opposite to each other. The light-emitting elements are disposed on the first surface, and at least one of the driver chips is disposed on the second surface. The first connection vias penetrate the substrate. At least one of the driver chips is electrically connected to a respective one of the light-emitting elements through a respective one of the first connection vias.

Embodiments of the present disclosure provide a backlight module. The backlight module includes a light-emitting panel and an optical structure disposed at a light exiting side of the light-emitting panel. The light-emitting panel includes a substrate, light-emitting elements, driver chips, and first connection vias. The substrate includes a first surface and a second surface disposed opposite to each other. The light-emitting elements are disposed on the first surface, and at least one of the driver chips is disposed on the second surface. The first connection vias penetrate the substrate. At least one of the driver chips is electrically connected to a respective one of the light-emitting elements through a respective one of the first connection vias.

Embodiments of the present disclosure provide a display device. The device includes a backlight module. The backlight module includes a light-emitting panel and an optical structure disposed at a light exiting side of the light-emitting panel. The light-emitting panel includes a substrate, light-emitting elements, driver chips, and first connection vias. The substrate includes a first surface and a second surface disposed opposite to each other. The light-emitting elements are disposed on the first surface, and at least one of the driver chips is disposed on the second surface. The first connection vias penetrate the substrate. At least one of the driver chips is electrically connected to a respective one of the light-emitting elements through a respective one of the first connection vias.

BRIEF DESCRIPTION OF DRAWINGS

To illustrate solutions in embodiments of the present disclosure more clearly, the drawings used in the description of the embodiments will be briefly described below. Apparently, the drawings described below illustrate part of embodiments of the present disclosure, and those of ordinary skill in the art may obtain other drawings based on the drawings described below on the premise that no creative work is done.

DETAILED DESCRIPTION

The solutions in embodiments of the present disclosure are described clearly and completely in conjunction with the drawings in the embodiments of the present disclosure from which the solutions are better understood by those skilled in the art. Apparently, the embodiments described below are part, not all, of the embodiments of the present disclosure. Based on the embodiments described herein, all other embodiments obtained by those skilled in the art on the premise that no creative work is done are within the scope of the present disclosure.

It is to be noted that the terms "first", "second" and the like in the description, claims and drawings of the present disclosure are used to distinguish between similar objects and are not necessarily used to describe a particular order or sequence. It should be understood that the data so used is interchangeable under appropriate circumstances such that the embodiments of the present disclosure described herein are capable of operation in sequences other than those illustrated or otherwise described herein. In addition, the terms "comprise", "include" or any other variations thereof herein are intended to encompass a non-exclusive inclusion, such that a system, product or device that contains a series of steps or units is not necessarily limited to those structures or units expressly listed herein but may also include other structures or units not expressly listed or inherent to such product or device.

Figure 1:
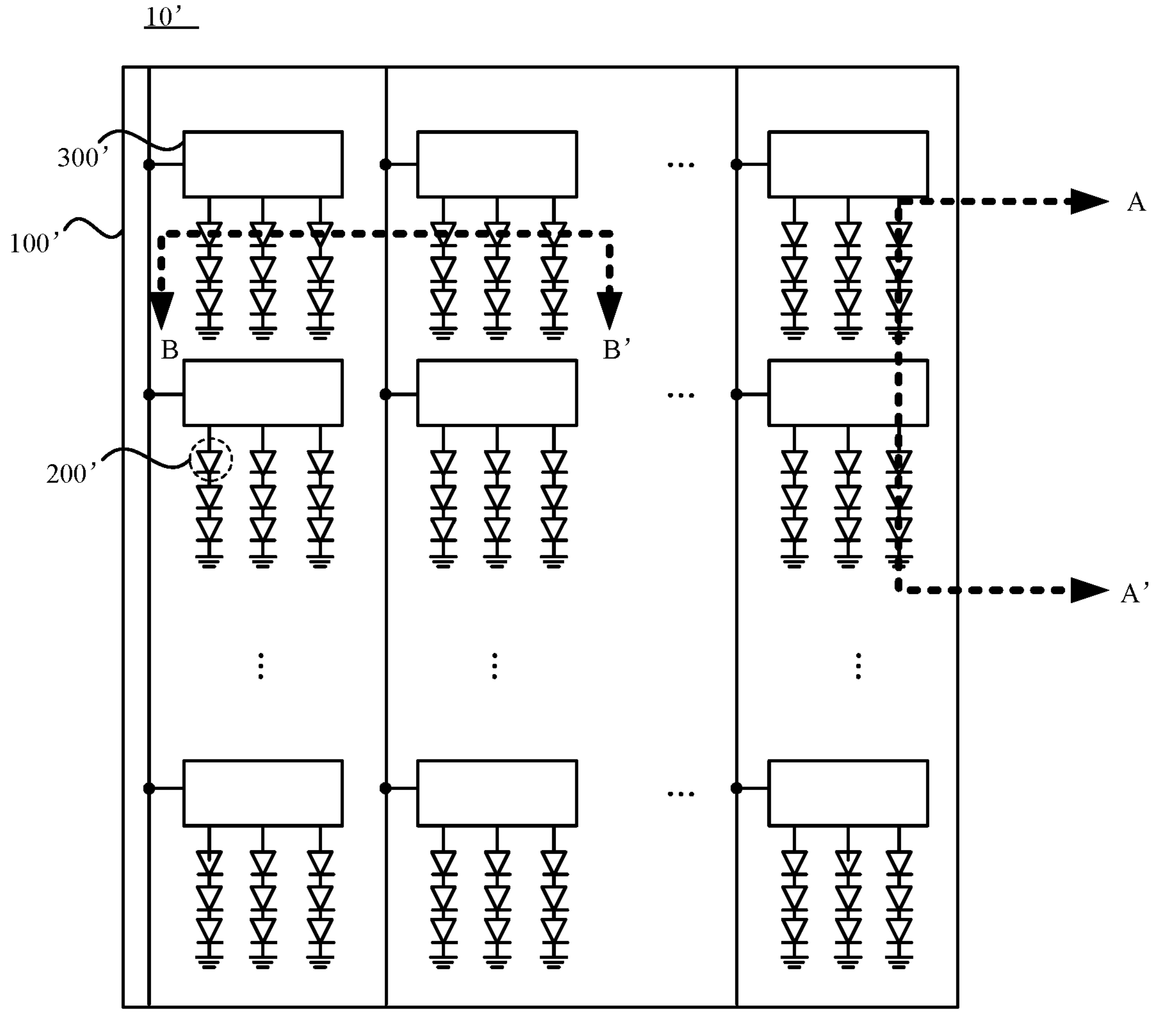
FIG. 1 is a structure diagram of a light-emitting panel in the related art.
Figure 2:
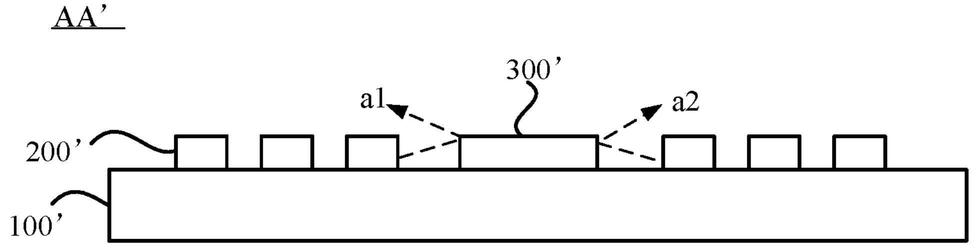
FIG. 2 is a sectional view of the light-emitting panel of FIG. 1 taken along section line A-A'.
Figure 3:
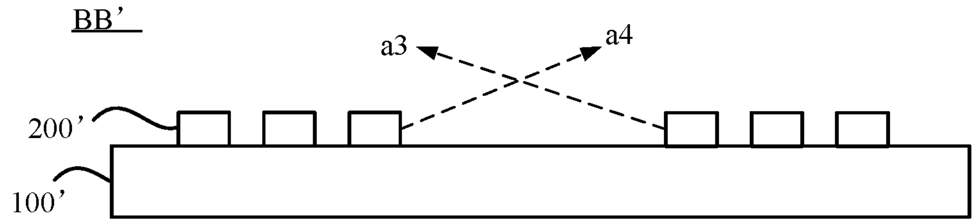
FIG. 3 is a sectional view of the light-emitting panel of FIG. 1 taken along section line B-B'.

FIG. 1 is a structure diagram of a light-emitting panel in the related art. FIG. 2 is a sectional view of the light-emitting panel of FIG. 1 taken along section line A-A'. FIG. 3 is a sectional view of the light-emitting panel of FIG. 1 taken along section line B-B'. With reference to FIGS. 1 to 3, the light-emitting panel 10' includes a substrate 100', multiple light-emitting elements 200', and multiple driver chips 300'. The driver chips 300' may be, for example, micro integrated chips (micro ICs). The driver chips 300' each are electrically connected to the light-emitting elements 200' and transmit a drive signal to the light-emitting elements 200' to drive the light-emitting elements 200' to emit light.

However, in the related art, part of the driver chips 300' block the light emitted by the light-emitting elements 200'. As a result, the light is easily interfered, and it is not conducive to the overall light-emitting effect of the light-emitting panel 10'. Specifically, with reference to FIG. 2, a driver chip 300' is disposed between adjacent two light-emitting elements 200' in the light-emitting panel 10'. That is, the adjacent two light-emitting elements 200' emit light such as a1 and a2, and the transmission paths of the light a1 and light a2 may be changed due to the block of the provided driver chip 300' to the light a1 and light a2. With reference to FIG. 3, the driver chip 300' is not disposed between adjacent two light-emitting elements 200' in the light-emitting panel 10', that is, the light emitted by the adjacent two light-emitting elements 200', such as a3 and a4, are emitted directly. In general, two kinds of light transmissions provided in FIGS. 2 and 3 exist in the same light-emitting panel 10', and then the light-emitting panel 10' has uneven light transmission, affecting the light-emitting effect of the light-emitting panel 10'.

To solve the preceding technical problems, an embodiment of the present disclosure provides a light-emitting panel. The light-emitting panel includes a substrate, light-emitting elements, driver chips, and first connection vias. The substrate includes a first surface and a second surface disposed opposite to each other. The light-emitting elements are disposed on the first surface, and at least one of the driver chips is disposed on the second surface. The first connection vias penetrate the substrate. At least one of the driver chips is electrically connected to a respective one of the light-emitting elements through a respective one of the first connection vias. Part of the driver chips are disposed on the second surface of the substrate, that is, part of the driver chips are disposed on a different substrate surface from the light-emitting elements. Thus, the driver chips are effectively prevented from interfering with the light-emitting effect of the light-emitting elements, and more space can be provided for disposing light-emitting elements, thereby ensuring the light-emitting effect of the light-emitting panel.

The preceding is the core idea of the present disclosure. Based on the embodiments of the present disclosure, all other embodiments obtained by those of ordinary skill in the art are within the scope of the present disclosure on the premise that no creative work is done. Technical solutions in embodiments of the present disclosure are described clearly and completely hereinafter in conjunction with the drawings in the embodiments of the present disclosure.

Figure 4:
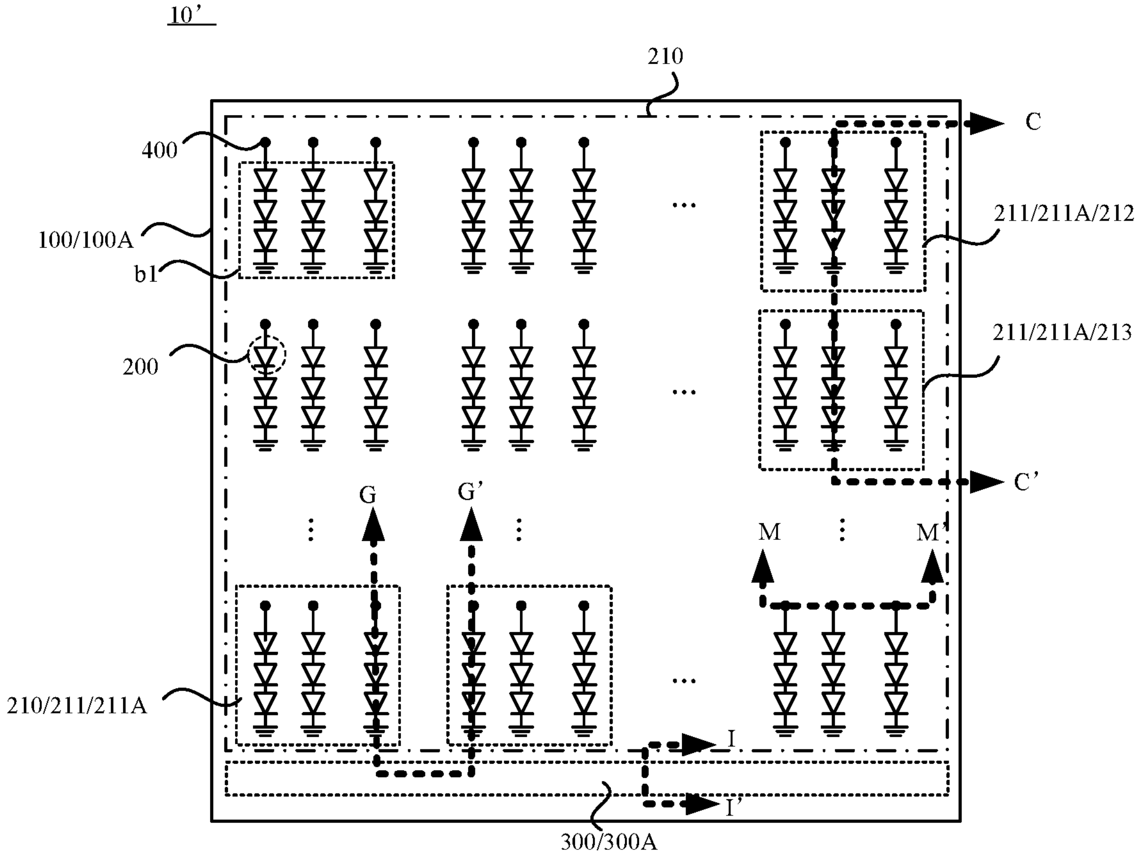
FIG. 4 is a structure diagram of a light-emitting panel according to an embodiment of the present disclosure.
Figure 5:
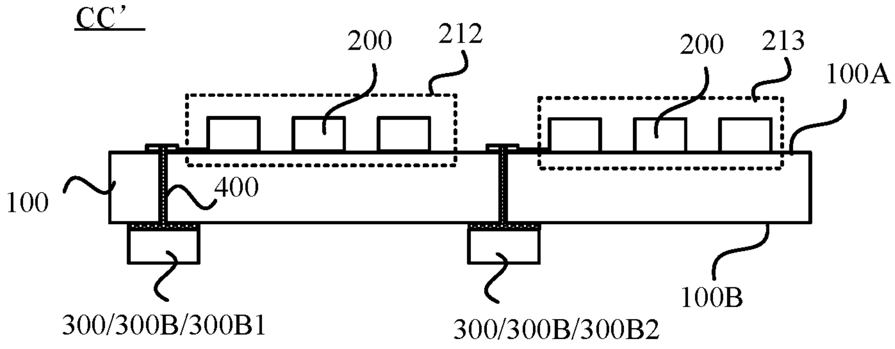
FIG. 5 is a sectional view of the light-emitting panel of FIG. 4 taken along section line C-C'.
Figure 6:
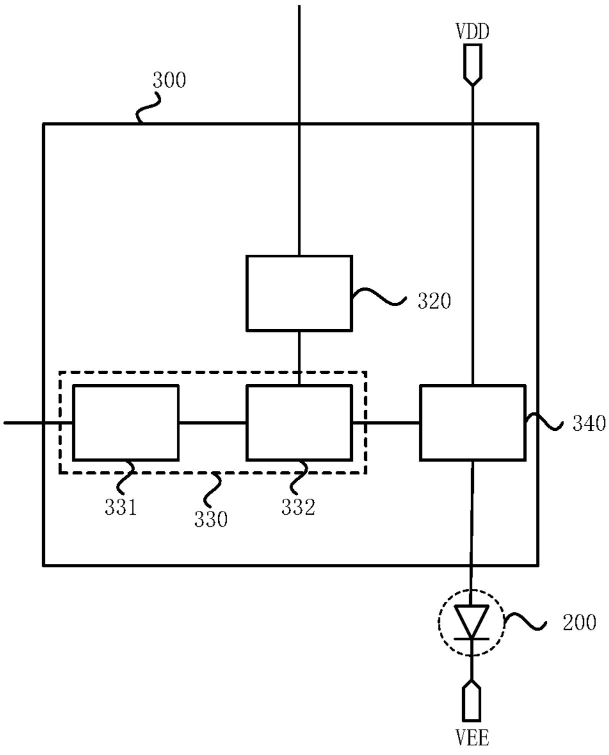
FIG. 6 is a structure diagram of a driver chip according to an embodiment of the present disclosure.
Figure 7:
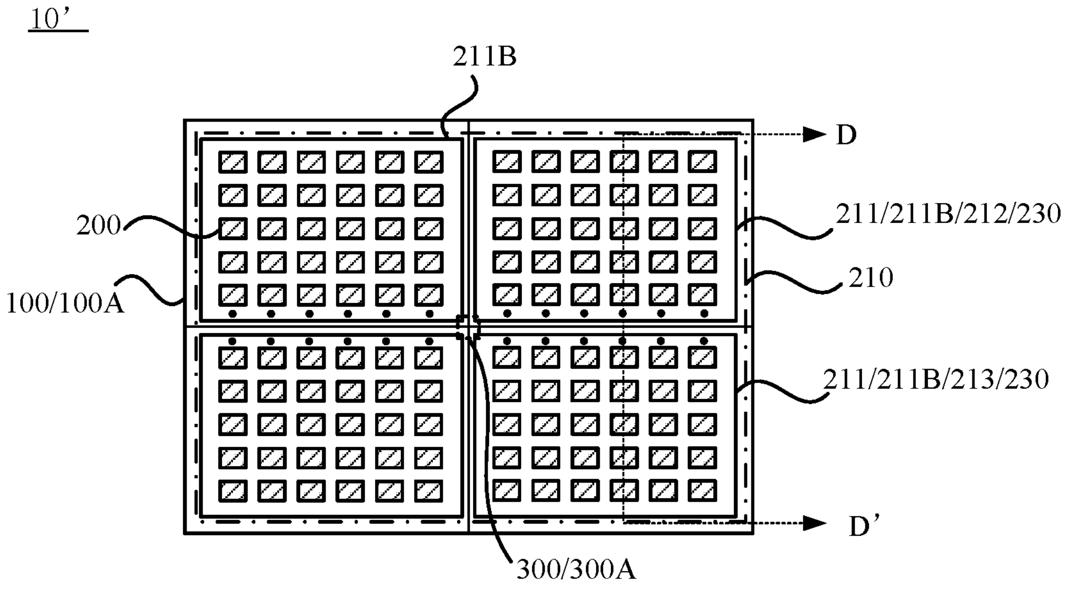
FIG. 7 is another structure diagram of a light-emitting panel according to an embodiment of the present disclosure.
Figure 8:
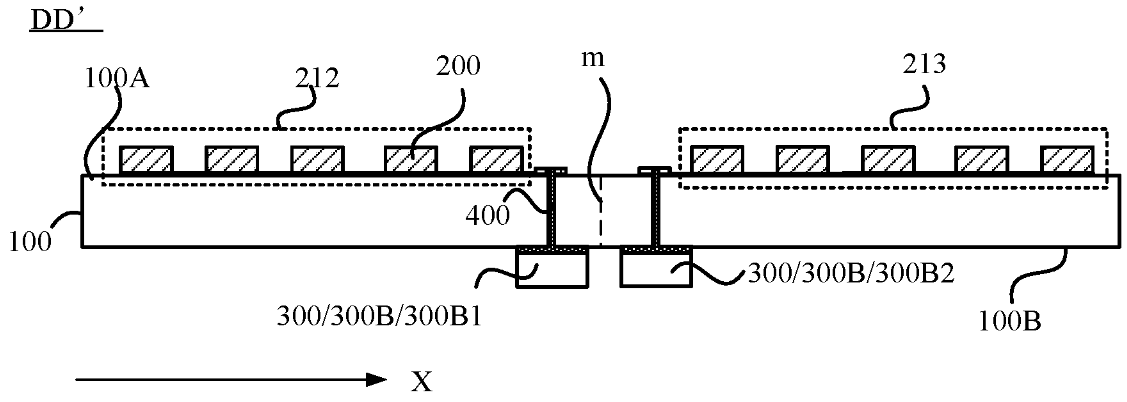
FIG. 8 is a sectional view of the light-emitting panel of FIG. 7 taken along section line D-D'.

FIG. 4 is a structure diagram of a light-emitting panel according to an embodiment of the present disclosure. FIG. 5 is a sectional view of the light-emitting panel of FIG. 4 taken along section line C-C'. FIG. 6 is a structure diagram of a driver chip according to an embodiment of the present disclosure. FIG. 7 is another structure diagram of a light-emitting panel according to an embodiment of the present disclosure. FIG. 8 is a sectional view of the light-emitting panel of FIG. 7 taken along section line D-D'. With reference to FIGS. 4 to 8, the light-emitting panel 10 provided by the embodiments of the present disclosure includes a substrate 100, light-emitting elements 200, driver chips 300, and first connection vias 400. The substrate 100 includes a first surface 100A and a second surface 100B disposed opposite to each other. The light-emitting elements 200 are disposed on the first surface 100A, and at least one of the driver chips 300 is disposed on the second surface 100B. The first connection vias 400 penetrate the substrate 100. At least one of the driver chips 300 is electrically connected to a respective one of the light-emitting elements 200 through a respective one of the first connection vias 400.

Specifically, the light-emitting panel 10 includes a substrate 100 and multiple light-emitting elements 200 located on one side of the substrate 100. The light-emitting elements 200 emit light to achieve the light-emitting effect of the light-emitting panel 10. For example, the light emitted by the light-emitting panel 10 may be used to achieve the display effect of a display device and may also be used to achieve the backlight effect of a backlight module, which is not limited in the embodiments of the present disclosure.

Specifically, the light-emitting panel 10 also includes driver chips 300. At least one of the driver chips 300 is configured to transmit a signal for driving the light-emitting elements 200 to emit light to the light-emitting elements 200 to ensure that the light-emitting elements 200 emit light, thereby achieving the light-emitting effect of the light-emitting panel 10. That is, the driver chips 300 are configured to transmit a light emission signal to the light-emitting elements 200 to maintain an electrical connection relationship with the light-emitting elements 200. Further, the substrate 100 includes a first surface 100A and a second surface 100B disposed opposite to each other. With reference to FIG. 5, the light-emitting elements 200 are disposed on the first surface 100A, and the driver chips 300 electrically connected to the light-emitting elements 200 are disposed on the second surface 100B. To ensure that the light-emitting elements 200 are electrically connected to the driver chips 300, first connection vias 400 penetrating the substrate 100 are disposed on the substrate 100, that is, the light-emitting elements 200 and the driver chips 300 electrically connected thereto located on two sides of the substrate 100 are electrically connected through connection structures deposited in the first connection vias 400. For example, the first connection vias 400 may include multiple connection vias. The number of first connection vias 400 is not limited in the embodiments of the present disclosure.

The light-emitting elements 200 and the driver chips 300 electrically connected thereto are disposed on the two sides of the substrate 100 respectively. In this manner, the driver chips 300 may be prevented from blocking the light emitted by the light-emitting elements 200 when the driver chips 300 and the light-emitting elements 200 are located on the same surface, thereby ensuring the light-emitting effect of the light-emitting elements 200. At the same time, the driver chips 300 are disposed on the other side of the substrate 100. In this manner, more space can be provided for disposing light-emitting elements 200, or the spacing gap between adjacent light-emitting elements 200 can be reduced to ensure the even light-emitting effect at each position of the light-emitting panel 10, thereby ensuring the light-emitting effect of the light-emitting panel 10.

For example, the light-emitting element 200 may be a micro light emitting diode (micro LED) or a mini light emitting diode (mini LED), and the type of the light-emitting element 200 is not limited in the embodiments of the present disclosure. The driver chip 300 that drives the light-emitting element 200 to emit light may be a micro integrated chip (micro IC). The driver chips 300 drive multiple micro diodes or mini diodes to emit light through the first connection vias 400. With reference to FIGS. 4 and 5, in the region b1 in the figure, nine light-emitting elements 200 are used as an example for illustration. The specific number of light-emitting elements 200 is not limited in the embodiments of the present disclosure. All the light-emitting elements 200 in the region b1 may be controlled by one driver chip 300. The light-emitting elements 200 in each column may be connected in series to ensure that the drive signal output by the driver chip 300 is transmitted to each light-emitting element 200. Further, the driver chips 300 and the light-emitting elements 20 are disposed on two sides of the substrate 100 to ensure that multiple micro diodes or mini diodes at each position of the light-emitting panel 10 emit light evenly and stably, thereby ensuring the light-emitting effect of the light-emitting panel 10.

In general, on the basis of the preceding embodiment, the light-emitting panel 10 may be applied to a micro LED light-emitting screen, that is, the light-emitting elements 200 are driven to emit light by micro ICs. At the same time, the light-emitting panel 10 may also be applied to a large-sized light-emitting screen formed by splicing multiple splicing screens, that is, each splicing screen is driven to emit light by a driver chip 300. The number of splicing screens is not limited in the embodiments of the present disclosure.

If the light-emitting panel 10 is a micro LED light-emitting screen, a brief description is given based on the working principle of a micro IC. Specifically, with reference to FIG. 6, the driver chip 300 is a micro IC. The driver chip 300 may include a data register 320, a pulse generation unit 330, and a switch 340. The specific devices of the driver chip 300 are not limited in the embodiments of the present disclosure. A data signal is written to the data register 320. At the same time, the pulse generation unit 330 includes a counter 331 and a comparator 332. The counter 331 may receive a pulse clock signal and count the number of pulses of the pulse clock signal. The comparator 332 is configured to generate a comparison signal according to the comparison result between the count value and the signal stored in the data register 320. Further, the input terminal of the switch 340 may be electrically connected to a positive power supply VDD. The output terminal of the switch 340 may be electrically connected to the anode of a light-emitting element 200. The cathode of the light-emitting element 200 may be electrically connected to a negative power supply VEE. At this time, the switch 340 may generate a drive current according to the comparison signal output by the comparator 332 and a positive power signal.

Further, with reference to FIGS. 7 and 8, the light-emitting panel 10 may be formed by a combination of multiple splicing screens 211B. Each splicing screen 211B is composed of multiple light-emitting elements 200 arranged in an array. In the figures, four splicing screens 211B are used as an example for illustration. Further, the light-emitting element 200 may be a micro light-emitting diode. The type of the light-emitting element 200 is not limited in the embodiments of the present disclosure. Further, each splicing screen 211B is controlled to emit light through the control signal output by the driver chip 300. To ensure that more splicing screens 211B may be arranged in the light-emitting panel 10, driver chips 300 are disposed on the other side of the substrate 100. In this manner, edges of the driver chips 300 may be prevented from affecting the splicing effect of the multiple splicing screens 211B, the area of a non-light-emitting bezel can be reduced, and the light-emitting effect of the light-emitting panel 10 can be better ensured, thereby ensuring the aesthetic appearance of the light-emitting panel 10.

In conclusion, in the light-emitting panel provided by the embodiments of the present disclosure, part of driver chips are disposed on the second surface of the substrate, that is, part of driver chips are disposed on a different substrate surface from the light-emitting elements. Thus, the driver chips are effectively prevented from interfering with the light-emitting effect of the light-emitting elements, and more space can be provided for disposing light-emitting elements, thereby ensuring the light-emitting effect of the light-emitting panel.

With continued reference to FIGS. 4 to 8, the light-emitting panel 10 also includes a light-emitting region 210. The light-emitting region 210 includes multiple light-emitting subregions 211. Each light-emitting subregion 211 includes at least one light-emitting element 200. Each driver chip 300 includes a main driver chip 300A and multiple driver subchips 300B connected to the main driver chip 300A. The driver subchip 300B is electrically connected to at least one light-emitting element 200 in at least one light-emitting subregion 211 through a respective one of the first connection vias 400.

Specifically, the light-emitting panel 10 also includes a light-emitting region 210. The light-emitting region 210 is on the side where the light-emitting elements 200 are disposed. Multiple light-emitting elements 200 emit light to achieve the light-emitting effect of the light-emitting panel 10. Further, the light-emitting region 210 includes multiple light-emitting subregions 211. The light-emitting region 210 is the entire region of the light-emitting panel 10 for emitting light. The light-emitting region 210 may be divided into multiple light-emitting subregions 211. Each light-emitting subregion 211 includes at least one light-emitting element 200. The number of light-emitting elements 200 in each light-emitting subregion 211 is not limited in the embodiments of the present disclosure.

Further, each driver chip 300 includes a main driver chip 300A and driver subchips 300B. The main driver chip 300A is electrically connected to each of the driver subchips 300B. Specifically, the main driver chip 300A is electrically connected to each of the driver subchips 300B to transmit the control signal, for example, to transmit a clock synchronization signal, of the main driver chip 300A to each of the driver subchips 300B. Further, the driver subchips 300B each are then electrically connected to light-emitting elements 200 to transmit a drive signal to the light-emitting elements 200. In the same light-emitting subregion 211, the light-emitting elements 200 in the light-emitting subregion 211 are driven by the same driver subchip 300B to emit light. Thus, the effect in which different light-emitting subregions 211 in the light-emitting panel 10 emit light synchronously is achieved.

Specifically, the driver subchips 300B and the light-emitting elements 200 are located on two sides of the substrate 100 respectively to ensure that the light-emitting panel 10 may be provided with a light-emitting region 210 of a higher density, thereby ensuring the light-emitting effect of the light-emitting panel 10. Further, each driver subchip 300B may control the light-emitting elements 200 in one or more light-emitting subregions 211 to be driven to emit light. The number of light-emitting subregions 211 controlled by each driver subchip 300B is not limited in the embodiments of the present disclosure.

For example, with reference to FIGS. 4 and 5, the light-emitting region 210 of the light-emitting panel 10 includes multiple light-emitting subregions 211. The light-emitting subregion 211 is a region 211A in which multiple light-emitting elements 200 are arranged in an array. The light-emitting elements 200 in the same light-emitting subregion 211 are driven and controlled to emit light by the same driver subchip 300B. The driver subchips 300B and the light-emitting elements 200 in the light-emitting subregions 211 are located on two sides of the substrate 100. Thus, the driver subchips 300B are effectively prevented from interfering with the light-emitting effect of the light-emitting elements 200, and more space can be provided for disposing light-emitting elements 200, thereby ensuring the light-emitting effect of the light-emitting panel 10. To ensure the electrical connection relationship between the main driver chip 300A and the driver subchips 300B, with reference to FIGS. 4 and 5, the main driver chip 300A and the driver subchips 300B may be disposed on the same side of the substrate 100 to implement the electrical connection. Alternatively, the main driver chip 300A and the driver subchips 300B may be disposed on two sides of the substrate 100 respectively, and the electrical connection relationship between the main driver chip 300A and the driver subchips 300B may be achieved through vias penetrating the substrate 100. The manner to achieve the electrical connection is not limited in the embodiments of the present disclosure.

For example, with reference to FIGS. 7 and 8, the light-emitting region 210 of the light-emitting panel 10 includes multiple light-emitting subregions 211. The multiple light-emitting subregions 211 may be multiple splicing screens 211B arranged in an array. The light-emitting elements 200 in each splicing screen 211B are driven and controlled to emit light by the same driver subchip 300B. In the figures, a description is given by using an example in which the light-emitting region 210 includes four light-emitting subregions 211, that is, the light-emitting region 210 includes four splicing screens 211B, but this embodiment is not limited thereto. The light-emitting subregions of the light-emitting region 210 of the light-emitting panel 10 may be other numbers such as 2, 3, 5, 6, or more. The driver subchip 300B and the light-emitting elements 200 in the splicing screen 211B are located on two sides of the substrate 100. Thus, the driver subchip 300B is effectively prevented from interfering with the light-emitting effect of the light-emitting elements 200, and more space can be provided for disposing more splicing screens 211B or more light-emitting elements 200. Moreover, the area of the non-light-emitting bezel existing between two splicing screens 211B is reduced, thereby ensuring the light-emitting effect of the light-emitting panel 10 and ensuring the aesthetic appearance of the light-emitting panel 10. To ensure the electrical connection relationship between the main driver chip 300A and the driver subchips 300B, with reference to FIGS. 7 and 8, the main driver chip 300A and the driver subchips 300B may be disposed on the same side of the substrate 100 to achieve the electrical connection. Alternatively, the main driver chip 300A and the driver subchips 300B may be disposed on two sides of the substrate 100 respectively, and the electrical connection relationship between the main driver chip 300A and the driver subchips 300B may be ensured through vias penetrating the substrate 100. The manner to achieve the electrical connection is not limited in the embodiments of the present disclosure.

With continued reference to FIGS. 4, 5, 7, and 8, multiple light-emitting subregions 211 include a first light-emitting subregion 212. Multiple driver subchips 300B include a first driver subchip 300B1. The first driver subchip 300B1 is electrically connected to at least one light-emitting element 200 in the first light-emitting subregion 212 through a respective one of the first connection vias 400. The first driver subchip 300B1 is disposed in the first light-emitting subregion 212.

The multiple light-emitting subregions 211 include a first light-emitting subregion 212. The first light-emitting subregion 212 may be any one of the light-emitting subregions 211. The multiple driver subchips 300B include a first driver subchip 300B1. Further, one or more light-emitting elements 200 in the first light-emitting subregion 212 are electrically connected to the first driver subchip 300B1 through a respective one or more of the first connection vias 400. The light-emitting elements 200 in the first light-emitting subregion 212 that are not directly electrically connected to the first driver subchip 300B1 may be connected in series to ensure the electrical connection to ensure that the first driver subchip 300B1 can drive all the light-emitting elements 200 in the first light-emitting subregion 212, thereby ensuring the light-emitting effect of the light-emitting panel 10.

Further, in the thickness direction of the substrate 100, the projection of the first driver subchip 300B1 overlaps the projection of the first light-emitting subregion 212. Specifically, the first driver subchip 300B1 is disposed in the first light-emitting subregion 212. In this manner, when the light-emitting elements 200 in the first light-emitting subregion 212 are electrically connected to the first driver subchip 300B1, the length of the connection wire located on the first surface 100A and/or the second surface 100B can be reduced. Thus, the loss of the drive signal on the wire is reduced, thereby further ensuring the light-emitting effect of the light-emitting elements 200.

For example, with reference to FIGS. 4 and 5, a description is given by using an example in which the light-emitting panel 10 may be a light-emitting screen of light-emitting diodes, that is, the light-emitting elements 200 are driven to emit light by micro ICs. The first driver subchip 300B1 and the light-emitting elements 200 are located on two sides of the substrate 100 respectively. In this manner, the first driver subchip 300B1 is effectively prevented from interfering with or blocking the light-emitting effect of the light-emitting elements 200 when the first driver subchip 300B1 and the light-emitting elements 200 are located on the same surface. At the same time, the first driver subchip 300B1 is not disposed on the first surface 100A of the substrate 100, and more space can be provided in the first light-emitting subregion 212 for disposing light-emitting elements 200, thereby ensuring the light-emitting effect of the light-emitting panel 10. Further, when the first driver subchip 300B1 is disposed in the first light-emitting subregion 212, the transmission distance of the connection wire between the first driver subchip 300B1 and the light-emitting elements 200 in the first light-emitting subregion 212 can be reduced. Thus, the loss of the drive signal on the wire is reduced, thereby ensuring the light-emitting effect of the light-emitting elements 200.

For example, with reference to FIGS. 7 and 8, a description is given by using an example in which the light-emitting panel 10 may also be applied to a large-sized light-emitting screen formed by splicing multiple splicing screens 211B. The dotted line m in FIG. 8 indicates the joint of different splicing screens 211B. The first driver subchip 300B1 and the light-emitting elements 200 are located on two sides of the substrate 100 respectively to ensure that the light-emitting elements 200 in the light-emitting panel 10 are not blocked by the first driver subchip 300B1 when emitting light, thereby ensuring the light-emitting effect of the light-emitting panel 10. At the same time, the first driver subchip 300B1 is not disposed on the first surface 100A of the substrate 100. In this manner, the number of light-emitting elements 200 disposed in the first light-emitting subregion 212 can be increased, and the area of the non-light-emitting bezel in which the driver chips 300 are disposed in the first light-emitting subregion 212 can be reduced, ensuring the aesthetic appearance when different splicing screens 211B are spliced. When the first driver subchip 300B1 is disposed in the first light-emitting subregion 212, the transmission distance of the connection wire between the first driver subchip 300B1 and the light-emitting elements 200 in the first light-emitting subregion 212 can be reduced. Thus, the loss of the drive signal on the wire is reduced, thereby ensuring the light-emitting effect of the light-emitting elements 200.

Figure 9:
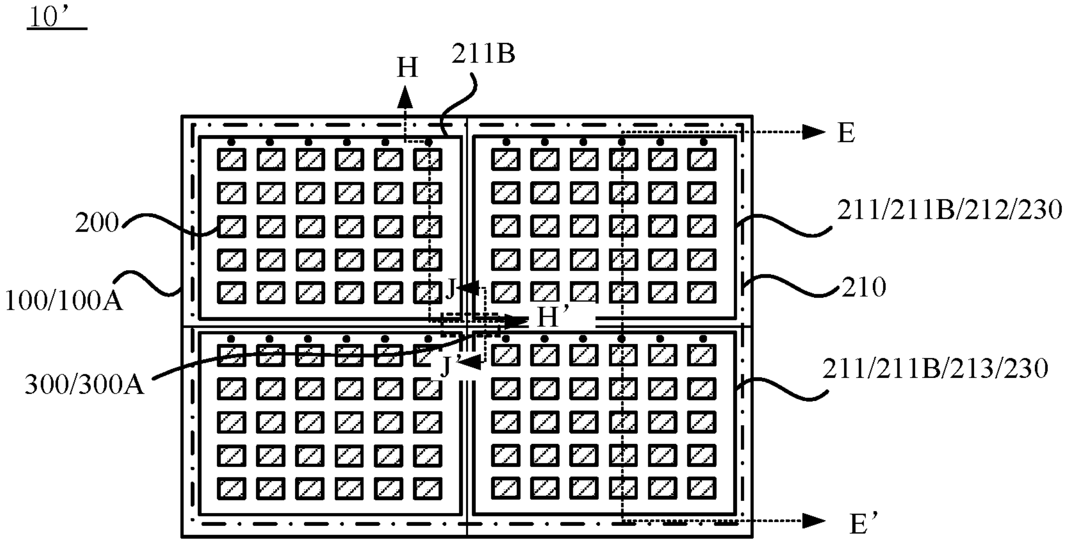
FIG. 9 is another structure diagram of a light-emitting panel according to an embodiment of the present disclosure.
Figure 10:
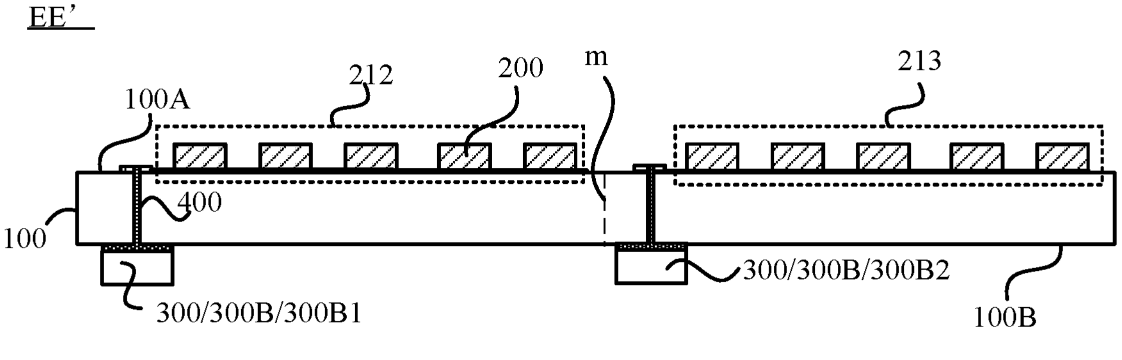
FIG. 10 is a sectional view of the light-emitting panel of FIG. 9 taken along section line E-E'.

FIG. 9 is another structure diagram of a light-emitting panel according to an embodiment of the present disclosure. FIG. 10 is a sectional view of the light-emitting panel of FIG. 9 taken along section line E-E'. With continued reference to FIGS. 4, 5, 9, and 10, the multiple light-emitting subregions 211 also include a second light-emitting subregion 213. The multiple driver subchips 300B also include a second driver subchip 300B2. The second driver subchip 300B2 is electrically connected to at least one light-emitting element 200 in the second light-emitting subregion 213 through a respective one of the first connection vias 400. The first driver subchip 300B1 has a first relative position with the first light-emitting subregion 212. The second driver subchip 300B2 is disposed in the second light-emitting subregion 213 and has a second relative position with the second light-emitting subregion 213. The first relative position is the same as the second relative position.

Specifically, the light-emitting subregions 211 include a first light-emitting subregion 212 and a second light-emitting subregion 213. The light-emitting elements 200 in the first light-emitting subregion 212 are electrically connected to the first driver subchip 300B1, and the light-emitting elements 200 in the second light-emitting subregion 213 are electrically connected to the second driver subchip 300B2 to ensure that light-emitting elements 200 at different positions are driven to emit light, thereby fulfilling the light-emitting function of the whole surface of the light-emitting panel 10.

Further, with reference to FIG. 5, when the first driver subchip 300B1 is disposed in the first light-emitting subregion 212, the transmission distance of the connection wire between the first driver subchip 300B1 and the light-emitting elements 200 in the first light-emitting subregion 212 can be reduced, that is, the loss of the drive signal on the wire is reduced, thereby ensuring the light-emitting effect of the light-emitting elements 200. Similarly, the second driver subchip 300B2 is disposed in the second light-emitting subregion 213 to further ensure that the transmission distances of the connection wires between the light-emitting elements 200 in multiple light-emitting subregions 211 in the light-emitting panel 10 and the driver subchips 300B electrically connected thereto are small, thereby minimizing the loss of the signal on the wires in the entire light-emitting panel 10 and ensuring the light-emitting effect of the light-emitting panel 10.

The first driver subchip 300B1 has the first relative position with the first light-emitting subregion 212. The first driver subchip 300B1 may be located in the edge region or the central region of the first light-emitting subregion 212. For example, with reference to FIG. 5, with the position relationship shown in the figure as an example, the first driver subchip 300B1 is disposed on the left edge of the first light-emitting subregion 212. Further, the relative position relationship between the first driver subchip 300B1 and the first light-emitting subregion 212 is diverse. For example, the first driver subchip 300B1 may be located in the center of the first light-emitting subregion 212, the first driver subchip 300B1 may be located at the upper left of the first light-emitting subregion 212, or the first driver subchip 300B1 may be located at the lower right of the first light-emitting subregion 212. The position descriptions such as upper left and lower right are described relative to the plane where the light-emitting subregions 211 are located, and the position descriptions are not limited in the embodiments of the present disclosure. Similarly, the second driver subchip 300B2 has the second relative position with the second light-emitting subregion 213. The second driver subchip 300B2 may be located in the edge region or the central region of the second light-emitting subregion 213. For example, with reference to FIG. 5, with the position relationship shown in the figure as an example, the second driver subchip 300B2 is disposed on the left edge of the second light-emitting subregion 214. Specifically, with reference to FIG. 5, the disposition tendency of the first relative position is the same as the disposition tendency of the second relative position.

Further, the relative position relationship between the first driver subchip 300B1 and the first light-emitting subregion 212 is the same as the relative position relationship between the second driver subchip 300B2 and the second light-emitting subregion 213, that is, the light-emitting subregions 211 in the light-emitting panel 10 and the driver subchips 300B electrically connected to the light-emitting elements 200 in the light-emitting subregions 211 adopt the same relative position relationship. For example, relative to a light-emitting subregion, driver subchips are all disposed on the left edge, the right edge, the upper edge, the lower edge, the lower left corner region, the upper right corner region, or the central region of the light-emitting subregion. The specific position relationship is not limited in the embodiments of the present disclosure as long as the relative position relationship between the first driver subchip 300B1 and the first light-emitting subregion 212 is the same as the relative position relationship between the second driver subchip 300B2 and the second light-emitting subregion 213. In this manner, in different light-emitting subregions of the entire light-emitting panel, the position relationship between the driver subchips and the light-emitting subregions is arranged orderly so that the process difficulty of the preparation of the light-emitting panel 10 can be reduced, reducing the preparation cost. Further, in different light-emitting subregions, the relative position relationships between the driver subchips and the light-emitting subregions are the same. The relative position relationships between the driver subchips 300B and the light-emitting elements in the light-emitting subregions are the same. The transmission paths of the drive signals of the light-emitting elements 200 are the same. That is, the light-emitting elements 200 in different light-emitting subregions 211 may have the same light-emitting effect, thereby ensuring that the light-emitting evenness of the light-emitting panel 10 is good. A description is given with reference to FIG. 4 and FIG. 5 by taking an example in which in the light-emitting panel 10, multiple light-emitting elements 200 are partitioned to form light-emitting subregions 211. Further, with reference to FIGS. 9 and 10, when the light-emitting panel 10 is composed of multiple splicing screens 211B, the position relationships between the driver subchips 300B driving different splicing screens 211B and the splicing screens 211B may also be the same, and the position relationships are not limited in the embodiments of the present disclosure.

Figure 11:
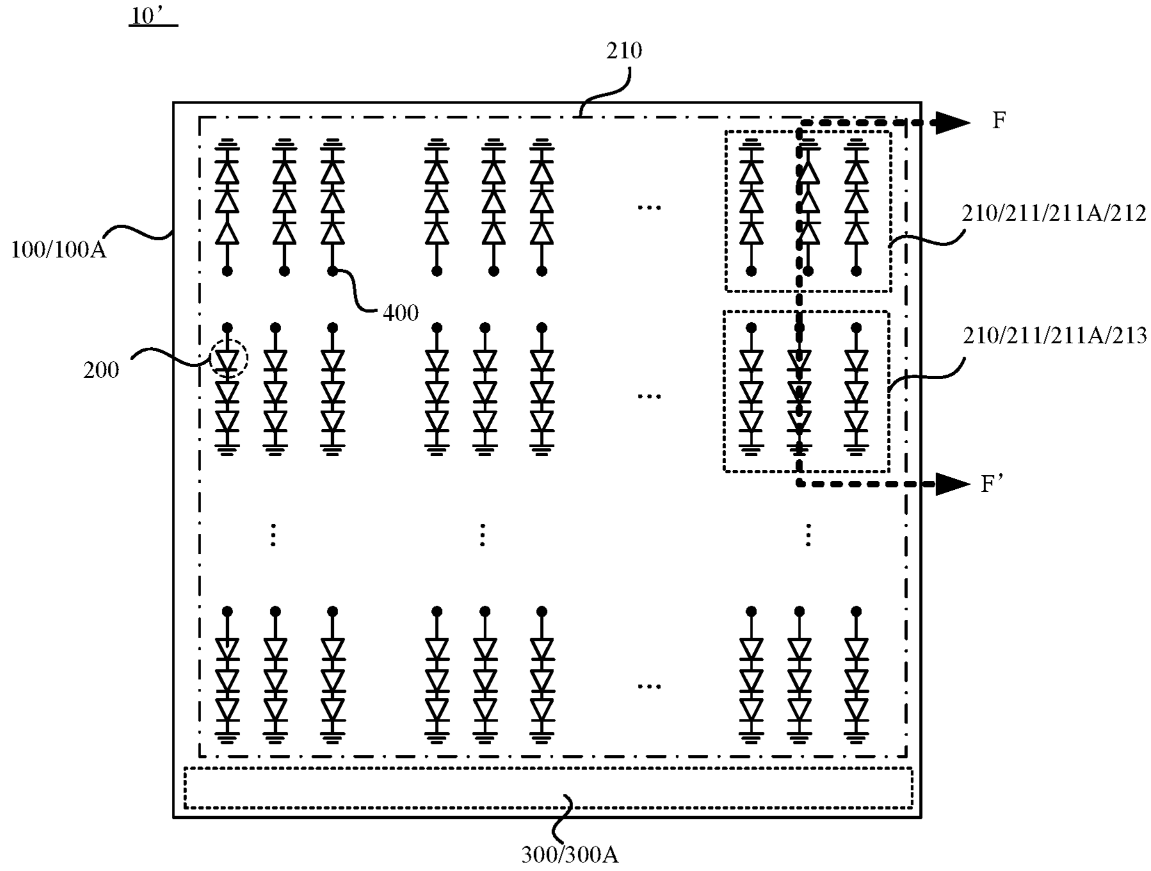
FIG. 11 is another structure diagram of a light-emitting panel according to an embodiment of the present disclosure.
Figure 12:
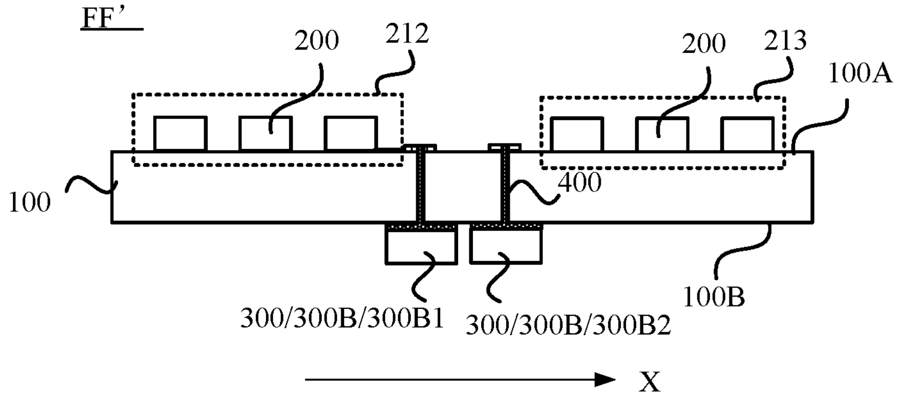
FIG. 12 is a sectional view of the light-emitting panel of FIG. 11 taken along section line F-F'.

FIG. 11 is another structure of a light-emitting panel according to an embodiment of the present disclosure. FIG. 12 is a sectional view of the light-emitting panel of FIG. 11 taken along section line F-F'. With continued reference to FIGS. 7, 8, 11, and 12, the multiple light-emitting subregions 211 also include a second light-emitting subregion 213. The multiple driver subchips 300B also include a second driver subchip 300B2. The second driver subchip 300B2 is electrically connected to at least one light-emitting element 200 in the second light-emitting subregion 213 through a respective one of the first connection vias 400. In a first direction X, the first light-emitting subregion 212 is disposed adjacent to the second light-emitting subregion 213. The first direction X is parallel to the plane in which the substrate 100 is located. The first driver subchip 300B1 is disposed on the side of the first light-emitting subregion 212 adjacent to the second light-emitting subregion 213. The second driver subchip 300B2 is disposed on the side of the second light-emitting subregion 213 adjacent to the first light-emitting subregion 212.

Specifically, the light-emitting panel 10 includes multiple light-emitting subregions 211. For example, with continued reference to FIGS. 4, 7, 11, and 12, a description is given by using an example in which the light-emitting subregions 211 include a first light-emitting subregion 212 and a second light-emitting subregion 213. The first light-emitting subregion 212 is disposed adjacent to the second light-emitting subregion 213 in the first direction X. The first driver subchip 300B1 and the second driver subchip 300B2 may be axisymmetrically disposed with the middle of the first light-emitting subregion 212 and the second light-emitting subregion 213 as an axis, that is, the distance between the first driver subchip 300B1 and the middle of the first light-emitting subregion 212 and the second light-emitting subregion 213 is equal to the distance between the second driver subchip 300B2 and the middle of the first light-emitting subregion 212 and the second light-emitting subregion 213 to ensure that the distance between the main driver chip 300A and the first driver subchip 300B1 and the distance between the main driver chip 300A and the second driver subchip 300B2 are the same or similar. Thus, the connections between the main driver chip 300A and multiple driver subchips 300B are simpler. For example, when the main driver chip 300A is disposed between the first driver subchip 300B1 and the second driver subchip 300B2, the distances between the main driver chip 300A and the multiple driver subchips 300B are small. The connection relationship becomes simple, and at the same time, the delay of the clock synchronization signals sent by the main driver chip 300A and received by the driver subchips 300B is reduced, thereby ensuring that the light-emitting synchronization of the light-emitting panel is good.

For example, with reference to FIGS. 7 and 8, the light-emitting panel 10 includes a first light-emitting subregion 212 and a second light-emitting subregion 213 that are adjacent to each other. The first light-emitting subregion 212 and the second light-emitting subregion 213 may be splicing screens 211B. With reference to FIGS. 11 and 12, the first light-emitting subregion 212 and the second light-emitting subregion 213 of the light-emitting panel 10 are light-emitting subregions 211 composed of multiple light-emitting elements 200, which is not limited in the embodiments of the present disclosure. The first driver subchip 300B1 is disposed on the side of the first light-emitting region 212 adjacent to the second light-emitting region 213. The second driver subchip 300B2 is disposed on the side of the second light-emitting region 213 adjacent to the first light-emitting region 212. That is, the first driver subchip 300B1 and the second driver subchip 300B2 are disposed opposite to each other or may be understood as being disposed in a "head-to-head" manner according to the position relationship in the drawings. The distance between the main driver chip 300A and the first driver subchip 300B1 and the distance between the main driver chip 300A and the second driver subchip 300B2 are the same or similar. The connection relationship becomes simple, and at the same time, the delay difference between the clock synchronization signals is reduced, thereby ensuring the overall synchronous light-emitting effect of the light-emitting panel 10.

Figure 13:
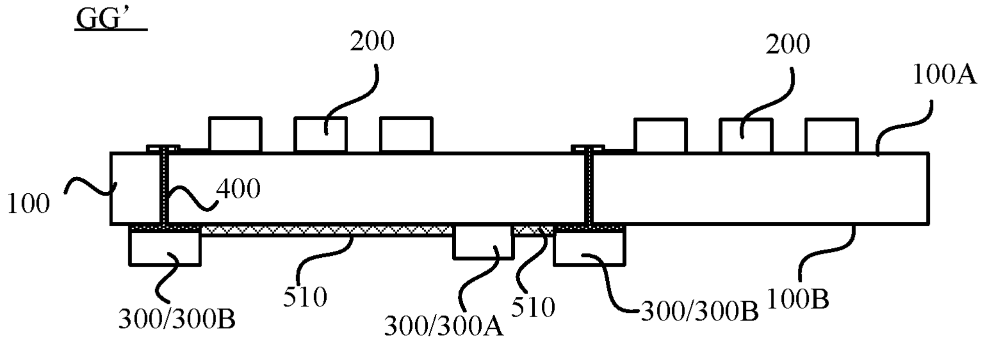
FIG. 13 is a sectional view of the light-emitting panel of FIG. 4 taken along section line G-G'.
Figure 14:
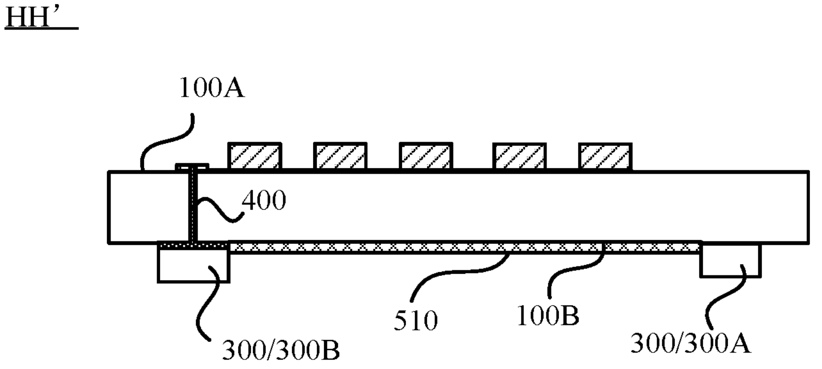
FIG. 14 is a sectional view of the light-emitting panel of FIG. 9 taken along section line H-H'.

FIG. 13 is a sectional view of the light-emitting panel of FIG. 4 taken along section line G-G'. FIG. 14 is a sectional view of the light-emitting panel of FIG. 9 taken along section line H-H'. With reference to FIGS. 13 and 14, the main driver chip 300A is disposed on the second surface 100B.

The driver chips 300 include a main driver chip 300A and driver subchips 300B. Each driver subchip 300B is electrically connected to at least one light-emitting element 200. The main driver chip 300A is electrically connected to the driver subchips 300B. In this manner, the light-emitting effect of the light-emitting panel 10 is ensured.

Further, the main driver chip 300A is disposed on the second surface 100B of the substrate 100. With continued reference to FIGS. 4, 9, 13, and 14, the main driver chip 300A and the driver subchips 300B are disposed in the same manner, and the main driver chip 300A is directly electrically connected to the driver subchips 300B on the second surface 100B. That is, the connection relationship is simple, thereby simplifying the preparation process and the preparation cost of the light-emitting panel 10.

For example, with reference to FIGS. 4 and 13, the light-emitting panel 10 may be a panel formed by a combination of light-emitting subregions 211 composed of multiple light-emitting elements 200. In this case, the main driver chip 300A controls the driver subchips 300B. The driver subchips 300B drive the light-emitting subregions 211 composed of the multiple light-emitting elements 200. In this manner, the light-emitting effect of the light-emitting panel 10 is achieved. Further, with reference to FIGS. 9 and 14, the light-emitting panel 10 may also be a panel formed by splicing multiple splicing screens 211B. The main driver chip 300A controls the driver subchips 300B. The driver subchips 300B control different splicing screens 211B, that is, light-emitting subregions 211. In this manner, the light-emitting effect of the light-emitting panel 10 is achieved. The above settings are not limited in the embodiments of the present disclosure.

With continued reference to FIGS. 13 and 14, the light-emitting panel 10 also includes a first flexible circuit board 510. The first flexible circuit board 510 is disposed on the second surface 100B. The first flexible circuit board 510 is electrically connected to the main driver chip 300A and the driver subchips 300B respectively.

In the light-emitting panel 10, the main driver chip 300A is electrically connected to the driver subchips 300B through the first flexible circuit board 510. The transmission of the clock synchronization signal may be achieved through the first flexible circuit board 510. Thus, the accurate control of the light-emitting effect of different light-emitting subregions 211 in the light-emitting panel 10 is ensured, thereby improving the overall light-emitting effect of the light-emitting panel 10.

Further, the main driver chip 300A and the driver subchips 300B are disposed on the second surface 100B of the substrate 100. The first flexible circuit board 510 configured to electrically connect the main driver chip 300A and the driver subchips 300B may designed in a non-bending manner, that is, the first flexible circuit board 510 may be tiled on the second surface 100B. Compared with the light-emitting panel 10 in which the first flexible circuit board 510 is designed in a bending manner, the space occupied by the first flexible circuit board 510 can be effectively reduced. Moreover, the first flexible circuit board 510 is in the non-bending state to ensure the service life of the first flexible circuit board 510, thereby improving the service life of the light-emitting panel 10 and ensuring the light-emitting effect of the light-emitting panel 10.

Figure 15:
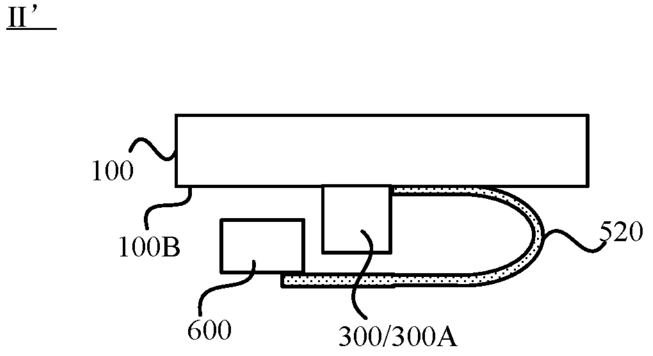
FIG. 15 is a sectional view of the light-emitting panel of FIG. 4 taken along section line I-I'.
Figure 16:
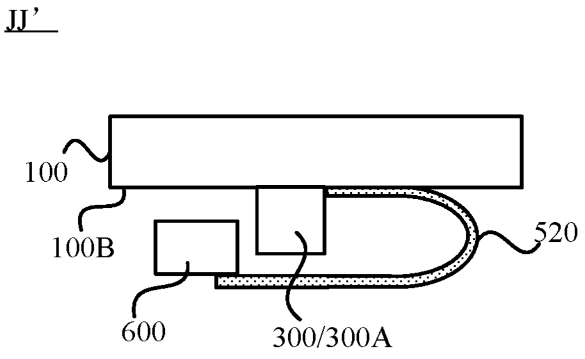
FIG. 16 is a sectional view of the light-emitting panel of FIG. 9 taken along section line J-J'.

FIG. 15 is a sectional view of the light-emitting panel of FIG. 4 taken along section line I-I'. FIG. 16 is a sectional view of the light-emitting panel of FIG. 9 taken along section line J-J'. With reference to FIGS. 15 and 16, the light-emitting panel 10 also includes a second flexible circuit board 520. The second flexible circuit board 520 is disposed on the second surface 100B. The second flexible circuit board 520 is electrically connected to the main driver chip 300A and a control mainboard 600 respectively. The second flexible circuit board may be disposed in a bending manner.

Specifically, with reference to FIGS. 15 and 16, the light-emitting panel 10 is a panel formed by a combination of light-emitting subregions 211 composed of multiple light-emitting elements 200. Alternatively, the light-emitting panel 10 is a panel formed by splicing multiple splicing screens 211B. The above settings are not limited in the embodiments of the present disclosure. The light-emitting panel 10 also includes a second flexible circuit board 520. The second flexible circuit board 520 is configured to electrically connect the main driver chip 300A and the control mainboard 600, thereby ensuring the light-emitting function of the light-emitting panel 10.

Specifically, the second flexible circuit board 520 needs to be disposed in a bending manner to achieve the electrical connection between the main driver chip 300A and the control mainboard 600. Further, the main driver chip 300A is disposed on the second surface 100B of the substrate 100. The second flexible circuit board 520 is also disposed on the second surface 100B. With this disposition, compared with the case where the second flexible circuit board 520 is disposed on the first surface 100A, the bending radius of the second flexible circuit board 520 can be reduced. Further, the bezel area of the non-light-emitting region of the light-emitting panel 10 is reduced, thereby improving the area of the light-emitting region of the light-emitting panel 10 and ensuring the light-emitting effect of the light-emitting panel 10.

Figure 17:
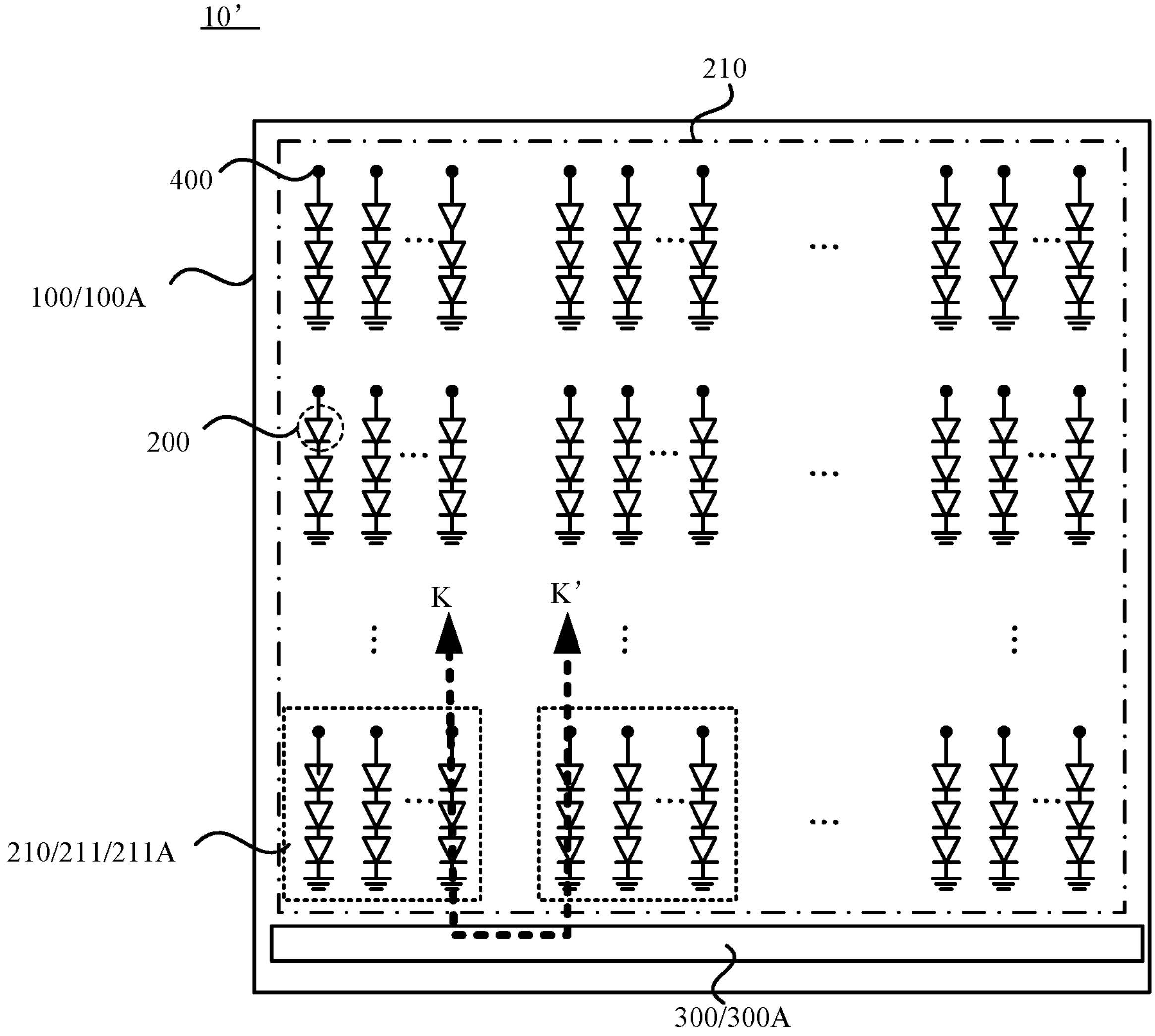
FIG. 17 is another structure diagram of a light-emitting panel according to an embodiment of the present disclosure.
Figure 18:
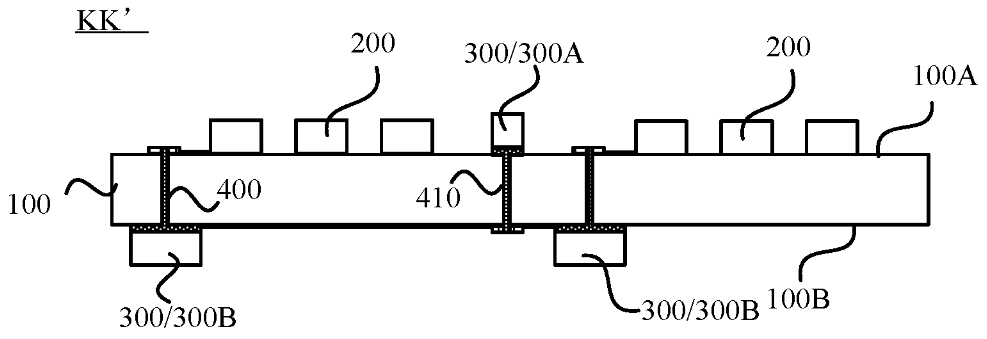
FIG. 18 is a sectional view of the light-emitting panel of FIG. 17 taken along section line K-K'.
Figure 19:
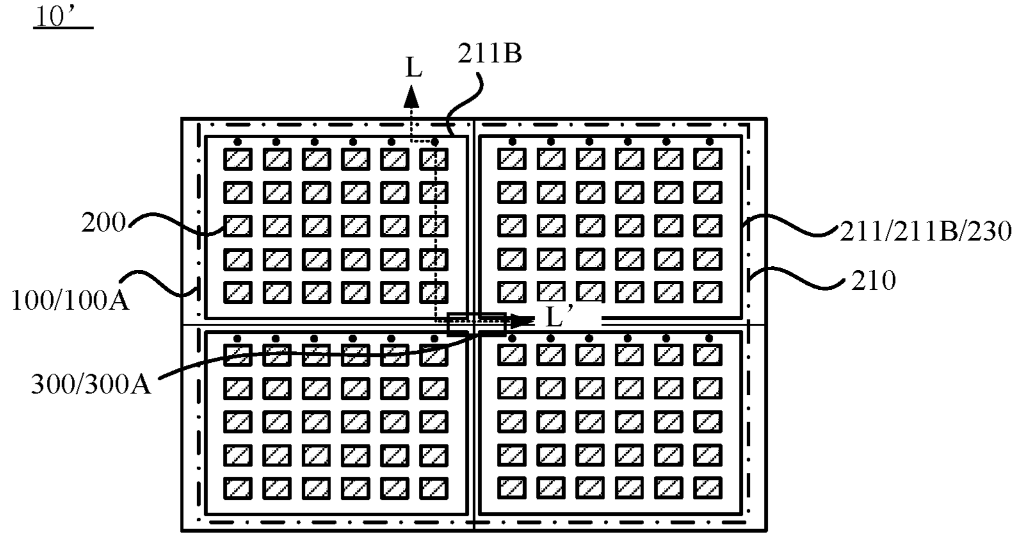
FIG. 19 is another structure diagram of a light-emitting panel according to an embodiment of the present disclosure.
Figure 20:
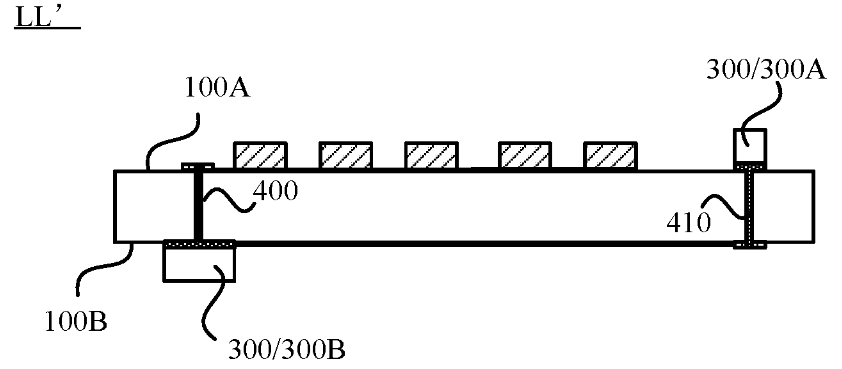
FIG. 20 is a sectional view of the light-emitting panel of FIG. 19 taken along section line L-L'.

FIG. 17 is another structure diagram of a light-emitting panel according to an embodiment of the present disclosure. FIG. 18 is a sectional view of the light-emitting panel of FIG. 17 taken along section line K-K'. FIG. 19 is another structure diagram of a light-emitting panel according to an embodiment of the present disclosure. FIG. 20 is a sectional view of the light-emitting panel of FIG. 19 taken along section line L-L'. With reference to FIGS. 17 to 20, the main driver chip 300A is disposed on the first surface 100A. The light-emitting panel 10 also includes second connection vias 410. The second connection vias 410 penetrate the substrate 100. The main driver chip 300A is electrically connected to each of the driver subchips 300B through a respective one of the second connection vias 410.

The driver subchips 300B are disposed on the second surface 100B of the substrate 100. The light-emitting elements 200 are disposed on the first surface 100A of the substrate 100. The electrical connections between the driver subchips 300B and the light-emitting elements 200 are achieved through the first connection vias 400 penetrating through the substrate 100. Further, with reference to FIGS. 17 and 20, the main driver chip 300A is disposed on the first surface 100A of the substrate 100, and the main driver chip 300A may be electrically connected to the driver subchips 300B through the second connection vias 410 penetrating the substrate 100.

Specifically, the second connection vias 410 may be prepared by the same process as the first connection vias 400. Thus, when the main driver chip 300A is electrically connected to the driver subchips 300B through the second connection vias 410, the process difficulty of the light-emitting panel 10 is not additionally increased. At the same time, when the main driver chip 300A is disposed on the first surface 100A of the substrate 100, the flexibility of the disposition position of the main driver chip 300A can be increased, and different actual requirements of the light-emitting panel 10 can be satisfied, thereby improving the diversity of the light-emitting panel 10.

With continued reference to FIGS. 7, 9, and 19, the light-emitting panel 10 includes multiple light-emitting subpanels 230. Each light-emitting subpanel 230 includes at least one light-emitting subregion 211.

Specifically, with continued reference to FIGS. 7, 9, and 19, the light-emitting panel 10 includes multiple light-emitting subpanels 230, that is, the light-emitting panel 10 is formed by splicing the multiple light-emitting subpanels 230. When the light-emitting panel 10 is a splicing screen, multiple light-emitting subpanels 230 are equivalent to multiple splicing screens 211B, thereby achieving a larger-sized light-emitting panel 10. Each light-emitting subpanel 230 may include at least one light-emitting subregion 211. With continued reference to FIGS. 7, 9, and 19, each light-emitting subpanel 230 includes one light-emitting subregion 211, that is, one light-emitting subpanel 230 is one splicing screen 211B. The number of light-emitting subregions 211 included in the light-emitting subpanel 230 is not limited in the embodiments of the present disclosure.

Figure 21:
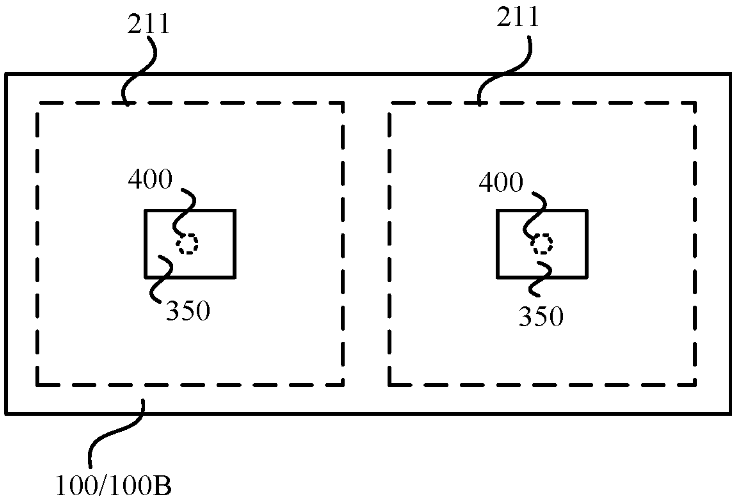
FIG. 21 is a bottom view of a light-emitting subregion according to an embodiment of the present disclosure.

FIG. 21 is a bottom view of a light-emitting subregion according to an embodiment of the present disclosure, that is, a view viewed from the side of the second surface. With reference to FIG. 21, the driver chips 300 include a power driver chip 350. The power driver chip 350 is disposed on the second surface 100B, electrically connected to each of the light-emitting elements 200 through a respective one of the first connection vias 400, and configured to provide a power signal for each of the light-emitting elements 200.

Specifically, the driver chips 300 in the light-emitting panel 10 also include a power driver chip 350. The power driver chip 350 is configured to provide the power signal for each of the light-emitting elements 200 to ensure that the light-emitting elements 200 emit light. On the basis of the electrical connection relationship between the light-emitting elements 200 and the power driver chip 350, since the light-emitting elements 200 are located on the first surface 100A of the substrate 100, in this embodiment of the present disclosure, with reference to FIG. 21, the power driver chip 350 is disposed on the second surface 100B of the substrate 100, that is, the power driver chip 350 and the light-emitting elements 200 are not disposed on the same surface. In this manner, more area on the first surface 100A of the substrate 100 is provided to dispose more light-emitting elements 200, and the power driver chip 350 does not block the light-emitting elements 200 of different light-emitting subregions 211 to ensure that the light-emitting elements 200 of each light-emitting subregion 211 of the whole light-emitting panel 10 have the same light-emitting effect, thereby further improving the overall light-emitting effect of the light-emitting panel 10.

Specifically, the power driver chip 350 may be electrically connected to each of the light-emitting elements 200 through a respective one of the first connection vias 400 to ensure that the power driver chip 350 is still electrically connected to the light-emitting elements 200 even if the power driver chip 350 and the light-emitting elements 200 are located on two sides of the substrate 100, thereby ensuring the stable acquisition of the power signal by the light-emitting elements 200. For example, the light-emitting panel 10 may be a light-emitting screen of light-emitting diodes, that is, the light-emitting elements 200 are driven to emit light by micro ICs. At the same time, the light-emitting panel 10 may also be applied to a large-sized light-emitting screen formed by splicing multiple splicing screens, that is, each splicing screen is driven to emit light by a driver chip 300. This is not limited in the embodiments of the present disclosure.

With continued reference to FIG. 21, the power driver chip 350 is disposed in the central region of the light-emitting panel 10. Alternatively, the light-emitting region 210 includes multiple light-emitting subregions 211. The driver chips 300 include multiple power driver chips 350. Each power driver chip 350 is disposed in the central region of a respective one of the light-emitting subregions 211.

If the light-emitting panel 10 includes multiple light-emitting subregions 211 and the multiple light-emitting subregions 211 share the same power driver chip 350, the power driver chip 350 is disposed in the central region of the light-emitting panel 10, that is, the power driver chip 350 is disposed in the center of the light-emitting region 210 of the light-emitting panel 10. In this manner, the lengths of the connection wires between the power driver chip 350 and different light-emitting subregions can be shortened, and the voltage drop generated when a power drive signal is transmitted to the light-emitting elements 200 is reduced, thereby ensuring the overall light-emitting evenness of the light-emitting panel 10. Alternatively, in the case where the light-emitting panel 10 may be formed by splicing multiple splicing screens 211B, in each light-emitting subregion 211, there is a power driver chip 350 electrically connected to the light-emitting elements 200 therein. To ensure that the voltage drop generated between the light-emitting elements 200 and the power source driver chip 350 in each light-emitting subregion 211 is similar, multiple power driver chips 350 each are disposed in the central region of a respective one of the light-emitting subregions 210 electrically connected thereto to ensure the overall light-emitting evenness of the light-emitting panel 10, thereby ensuring the light-emitting effect of the light-emitting panel 10.

Figure 22:
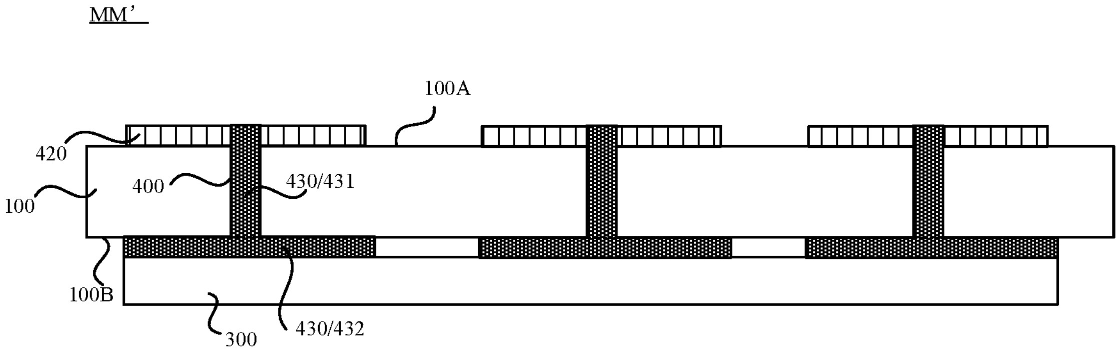
FIG. 22 is a sectional view of the light-emitting panel of FIG. 4 taken along section line M-M'.

FIG. 22 is a sectional view of the light-emitting panel of FIG. 4 taken along section line M-M'. With reference to FIGS. 4 and 22, the light-emitting panel 10 also includes a signal transmission portion 420. The signal transmission portion 420 is disposed on the first surface 100A and electrically connected to each of the light-emitting elements 200. The light-emitting panel 10 also includes a connection portion 430. The connection portion 430 includes first connection portions 431 and a second connection portion 432 connected to each of the first connection portions 431. The first connection portions 431 each are at least partially disposed in a respective one of the first connection vias 400. The second connection portion 432 is disposed on the second surface 100B. The first connection portions 431 each are electrically connected to the signal transmission portion 420. The second connection portion 432 is electrically connected to at least part of the driver chips 300.

Specifically, with reference to FIG. 22, the light-emitting panel 10 includes a signal transmission portion 420 and a connection portion 430. Through the signal transmission portion 420 and the connection portion 430, the light-emitting elements 200 are electrically connected to the driver chips 300 through the first connection vias 400 to ensure that the light-emitting elements 200 are driven to emit light, thereby achieving the light-emitting effect of the light-emitting panel 10.

Further, with reference to FIG. 22, the signal transmission portion 420 is disposed on the first surface 100A to ensure that the signal transmission portion 420 is electrically connected to the light-emitting elements 200. The connection portion 430 includes a second connection portion 432. The second connection portion 432 is located on the second surface 100B to ensure that the second connection portion 432 is electrically connected to the driver chips 300. The first connection portion 431 included in the connection portion 430 is at least partially located in the first connection via 400. The first connection portion 431 is electrically connected to the signal transmission portion 420 and the second connection portion 432 respectively. That is, the first connection portion 431 is equivalent to a "bridge" to ensure the electrical connection between the light-emitting elements 200 on the first surface 100A and the driver chip 300 on the second surface 100B. In general, the light-emitting elements 200 are electrically connected to the driver chips 300, and at the same time, the light-emitting elements 200 and the driver chips 300 are located on two sides of the substrate 100 respectively. Thus, the driver chips 300 are effectively prevented from interfering with the light-emitting effect of the light-emitting elements 200, and more space can be provided for disposing light-emitting elements 200, thereby ensuring the light-emitting effect of the light-emitting panel 10.

Figure 23:
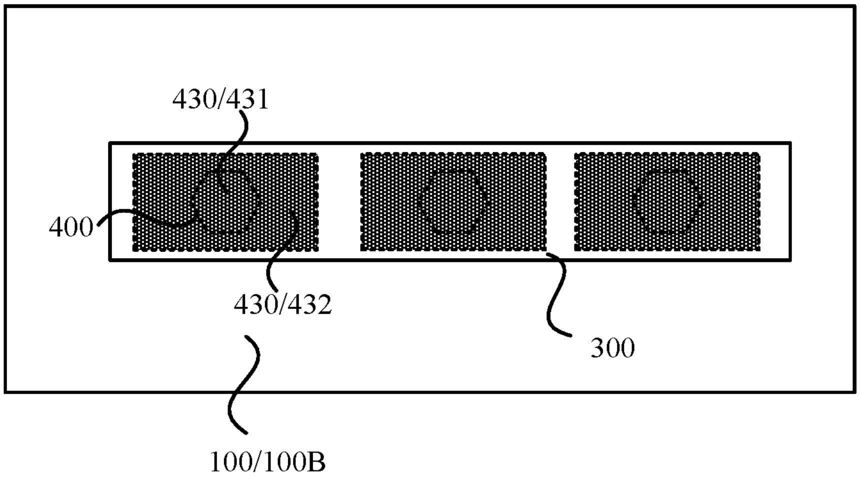
FIG. 23 is a bottom view of a driver chip binding structure according to an embodiment of the present disclosure.
Figure 24:
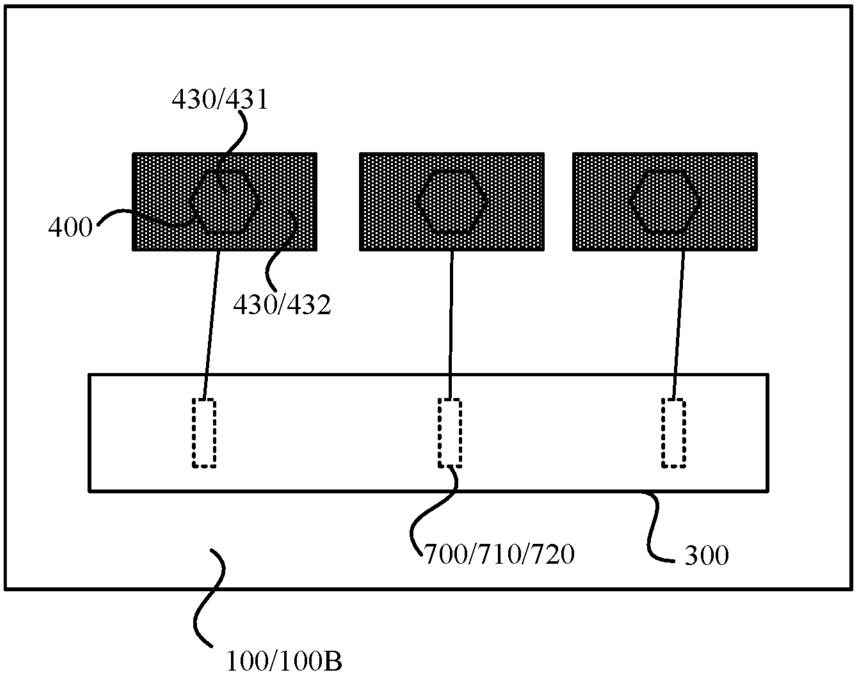
FIG. 24 is another bottom view of a driver chip binding structure according to an embodiment of the present disclosure.

FIG. 23 is a bottom view of a driver chip binding structure according to an embodiment of the present disclosure. FIG. 24 is another bottom view of a driver chip binding structure according to an embodiment of the present disclosure. With reference to FIGS. 23 and 24, the second connection portion 432 is in contact with and electrically connected to at least one of the driver chips 300. Alternatively, the light-emitting panel 10 also includes a pad structure 700. The pad structure 700 includes multiple pads 710. At least one of the pads 710 is electrically connected to the second connection portion 432 and at least one of the driver chips 300.

Specifically, with reference to FIG. 23, the second connection portion 432 is in contact with and electrically connected to at least one of the driver chips 300 to ensure that the signal used by the driver chips 300 to drive the light-emitting elements 200 can be transmitted through the connection portion 430 and the signal transmission portion 420, thereby ensuring the light-emitting effect of the light-emitting panel 10.

Further, with reference to FIG. 24, the light-emitting panel 10 may also include a pad structure 700. The driver chip 300 is electrically connected to the second connection portion 432 through the pad structure 700. Specifically, the pad structure 700 includes multiple pads 710. The pads 710 are electrically connected to the second connection portion 432. The driver chips 300 also include chip pads 720. The chip pads 720 are aligned with and attached to the pads 710 to achieve the electrical connection between the driver chips 300 and the second connection portion 432, thereby ensuring the light-emitting effect of the light-emitting panel 10. The pad structure 700 is configured to implement a more flexible disposition method of the driver chips 300, thereby improving the diversified design of the light-emitting panel 10.

Figure 25:
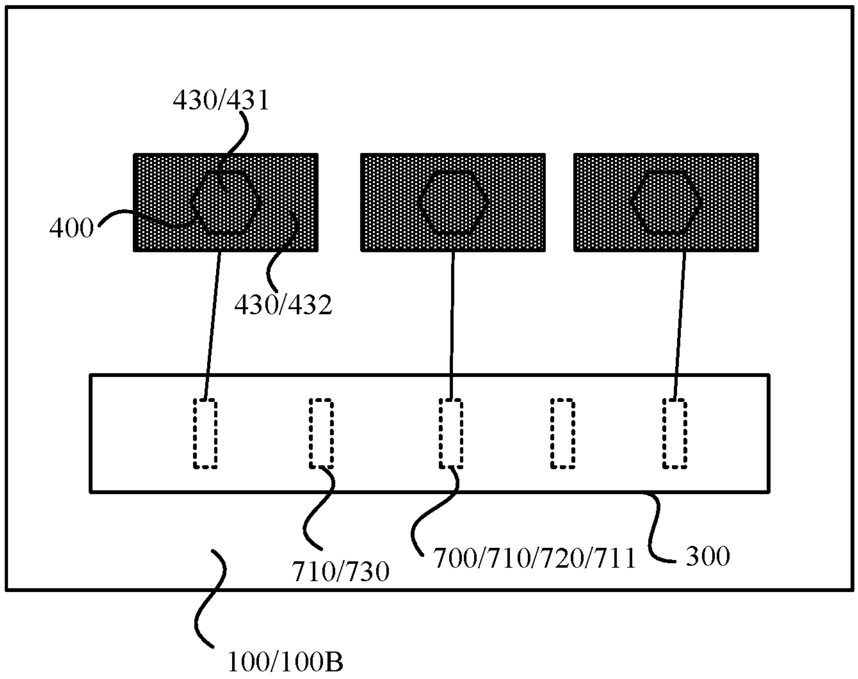
FIG. 25 is another bottom view of a driver chip binding structure according to an embodiment of the present disclosure.

FIG. 25 is another bottom view of a driver chip binding structure according to an embodiment of the present disclosure. With reference to FIG. 25, the pads 710 include connection pads 711 and dummy pads 730. The connection pad 711 is electrically connected to the second connection portion 432 and at least one of the driver chips 300. Each virtual pad 730 is disposed between adjacent two connection pads 711.

With reference to FIG. 25, the pads 710 include connection pads 711 and dummy pads 730. The connection pads 711 achieve the electrical connection between the second connection portion 432 and the driver chips 300, that is, the connection pads 711 are electrically connected to the second connection portion 432, and at the same time, the connection pads 711 are also aligned with and attached to the chip pads 720 in the driver chips 300. The potential of the virtual pad 730 is floating, that is, the dummy pads 730 are neither electrically connected to the second connection portion 432 nor electrically connected to the driver chips 300. That is, the driver chips 300 cannot transmit the drive signal through the dummy pads 730.

Further, a virtual pad 730 is disposed between adjacent two connection pads 711 to protect the connection pads 711. Specifically, when the light-emitting panel 10 starts to be powered on, an electric field may be formed between pads 710. If water vapor exists in the formed electric field environment, an electrochemical corrosion reaction occurs on the pads 710 under the action of the electric field. As a result, the service life and the light-emitting stability of the light-emitting panel 10 are affected. The virtual pad 730 is equivalent to a protection structure and can weaken the electric field intensity formed between adjacent two connection pads 711 to protect the connection pads 711, thereby protecting the light-emitting panel 10. Further, to avoid the influence of the external water vapor on the pad structure 700, the pad structure 700 is isolated from the external environment by sealing, thereby ensuring that the light-emitting panel 10 emits light stably and improving the service life of the light-emitting panel 10.

Figure 26:
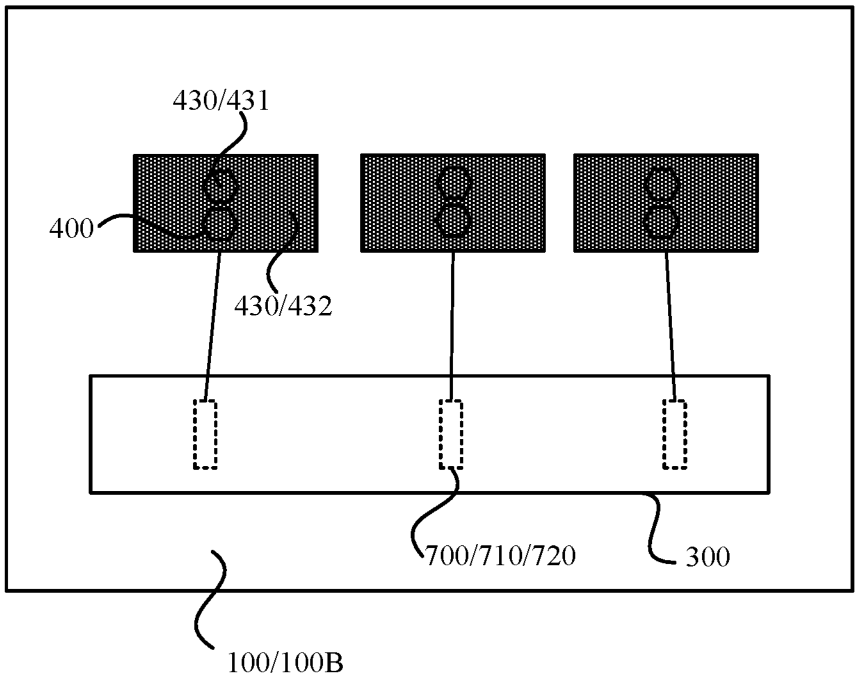
FIG. 26 is another bottom view of a driver chip binding structure according to an embodiment of the present disclosure.

FIG. 26 is another bottom view of a driver chip binding structure according to an embodiment of the present disclosure. With reference to FIG. 26, at least one of the driver chips 300 is electrically connected to the light-emitting elements 200 through multiple first connection vias 710.

Specifically, with reference to FIG. 24, there may be one first connection via 710 in each second connection portion 432. With reference to FIG. 26, there may be multiple first connection vias 710 in each second connection portion 432. Further, in the case where the driver chips 300 are electrically connected to light-emitting elements 200, the number of first connections vias 710 is increased to ensure the stability of the electrical connection. At the same time, the resistance connected between a driver chip 300 and a light-emitting element 200 can be reduced to ensure that the driver chip 300 better drives the light-emitting element 200 to emit light, thereby further ensuring the light-emitting effect of the light-emitting panel 10.

With reference to FIGS. 4 to 20, the light-emitting element 200 includes a micro light-emitting diode or a mini light-emitting diode.

Further, the light-emitting element 200 included in the light-emitting panel 10 may be a micro light-emitting diode or a mini light-emitting diode. The light-emitting panel 10 using micro light-emitting diodes or mini light-emitting diodes has many advantages such as self-luminescence, a low drive voltage, high light-emitting efficiency, a short response time, high definition, and high contrast. Moreover, since the size of the micro light-emitting diode or the mini light-emitting diode is small, the light-emitting element 200 is configured to include a micro light-emitting diode or a mini light-emitting diode so that more light-emitting elements can be disposed in the same light-emitting region, thereby improving the light-emitting resolution of the light-emitting panel. For example, the size of a mini light-emitting diode is between 100 microns and 500 microns, and the size of a micro light-emitting diode may be smaller than 100 microns. The above sizes are not limited in the embodiments of the present disclosure.

Figure 27:
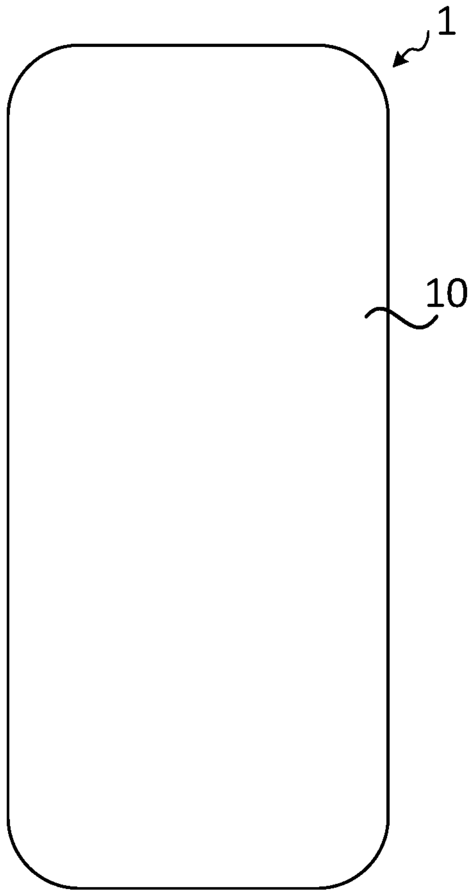
FIG. 27 is a structure diagram of a display device according to an embodiment of the present disclosure.

Based on the same inventive concept, an embodiment of the present disclosure provides a display device. FIG. 27 is a structure diagram of a display device according to an embodiment of the present disclosure. As shown in FIG. 27, the display device 1 includes the light-emitting panel 10 described in any of the preceding embodiments. Thus, the display device 1 provided in this embodiment of the present disclosure has the corresponding beneficial effects in the preceding embodiments, and the details are not repeated here. For example, the display device 1 may be a mobile phone, a computer, a smart wearable device (for example, a smart watch), an in-vehicle display device, and other electronic devices. The type of the display device 1 is not limited in the embodiments of the present disclosure.

Figure 28:
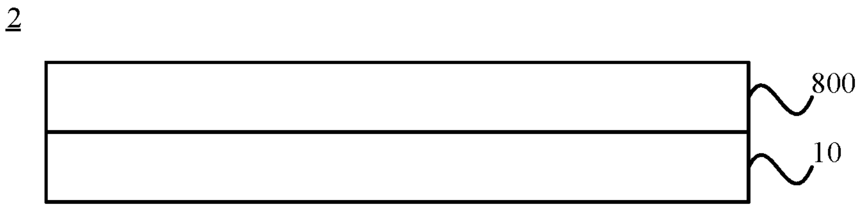
FIG. 28 is a structure diagram of a backlight module according to an embodiment of the present disclosure.

Based on the same inventive concept, an embodiment of the present disclosure provides a backlight module. FIG. 28 is a structure diagram of a backlight module according to an embodiment of the present disclosure. As shown in FIG. 28, the backlight module 2 includes the light-emitting panel 10 according to any embodiment of the present disclosure and also includes an optical structure 800 located on the light exiting side of the light-emitting panel 10. For example, the optical structure 800 may include stacked optical films such as diffusion films, brightness enhancement films, and uniform light films, which is beneficial to improving the light-emitting effect of the backlight module 2. The specific structure of the optical structure 800 is not limited in the embodiments of the present disclosure. The backlight module 2 provided in this embodiment of the present disclosure has the technical effects of the technical solutions in any of the preceding embodiments. The explanations of the structures and terms that are the same as or corresponding to those in the preceding embodiments are not repeated here.

Figure 29:
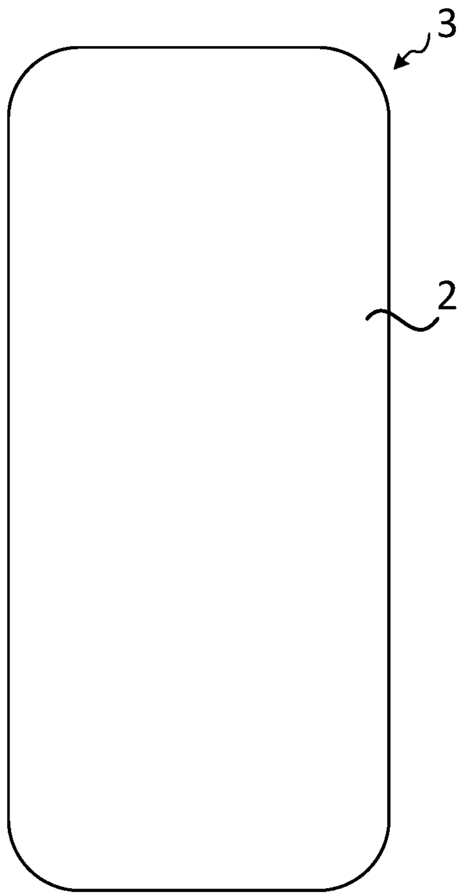
FIG. 29 is another structure diagram of a display device according to an embodiment of the present disclosure.

Based on the same inventive concept, an embodiment of the present disclosure provides a display device. FIG. 29 is another diagram structure of a display device according to an embodiment of the present disclosure. As shown in FIG. 29, the display device 3 includes the backlight module 2 described in any of the preceding embodiments. Thus, the display device 3 provided in this embodiment of the present disclosure has the corresponding beneficial effects in the preceding embodiments, and the details are not repeated here. For example, the display device 3 may be a mobile phone, a computer, a smart wearable device (for example, a smart watch), an onboard display device, and other electronic devices. The type of the display device 3 is not limited in the embodiments of the present disclosure.

What is claimed is:

1. A light-emitting panel, comprising:

a substrate comprising a first surface and a second surface disposed opposite to each other;

light-emitting elements and driver chips, wherein the light-emitting elements are disposed on the first surface, and at least one of the driver chips is disposed on the second surface; and first connection vias penetrating through the substrate, wherein the at least one of the driver chips is electrically connected to a respective one of the light-emitting elements through a respective one of the first connection vias;

wherein the light-emitting panel further comprises a light-emitting region, the light-emitting region comprises a plurality of light-emitting subregions, each of the plurality of light-emitting subregions comprises at least one of the light-emitting elements; the driver chips comprise a main driver chip and a plurality of driver subchips, the main driver chip is connected to each driver subchip of the plurality of driver subchips to transmit a control signal, the each driver subchip is electrically connected to the at least one light-emitting element in at least one of the plurality of light-emitting subregions through a respective one of the first connection vias to transmit a drive signal, and the at least one of the light-emitting elements in a same light-emitting subregion are driven by a same driver subchip; and wherein the main driver chip is disposed on the first surface; and the light-emitting panel further comprises second connection vias penetrating through the substrate, and the main driver chip is electrically connected to each of the plurality of driver subchips through a respective one of the second connection vias.

2. The light-emitting panel according to claim 1, wherein the plurality of light-emitting subregions comprise a first light-emitting subregion, the plurality of driver subchips comprise a first driver subchip, and the first driver subchip is electrically connected to the at least one light-emitting element in the first light-emitting subregion through a respective one of the first connection vias; and the first driver subchip is disposed in the first light-emitting subregion.

3. The light-emitting panel according to claim 2, wherein the plurality of light-emitting subregions further comprise a second light-emitting subregion, the plurality of driver subchips further comprise a second driver subchip, and the second driver subchip is electrically connected to the at least one light-emitting element in the second light-emitting subregion through a respective one of the first connection vias;

the first driver subchip has a first relative position with the first light-emitting subregion, and the second driver subchip is disposed in the second light-emitting subregion and has a second relative position with the second light-emitting subregion; and the first relative position is the same as the second relative position.

4. The light-emitting panel according to claim 2, wherein the plurality of the light-emitting subregions further comprise a second light-emitting subregion, the plurality of the driver subchips further comprise a second driver subchip, and the second driver subchip is electrically connected to the at least one light-emitting element in the second light-emitting subregion through a respective one of the first connection vias;

the first light-emitting subregion is disposed adjacent to the second light-emitting subregion in a first direction, and the first direction is parallel to a plane in which the substrate is located; and the first driver subchip is disposed on a side of the first light-emitting subregion adjacent to the second light-emitting subregion, and the second driver subchip is disposed on a side of the second light-emitting subregion adjacent to the first light-emitting subregion.

5. The light-emitting panel according to claim 1, comprising a plurality of light-emitting subpanels, wherein each of the plurality of light-emitting subpanels comprises at least one of the plurality of light-emitting subregions.

6. The light-emitting panel according to claim 1, wherein the driver chips comprise a power driver chip, wherein the power driver chip is disposed on the second surface, electrically connected to each of the light-emitting elements through a respective one of the first connection vias, and configured to provide a power signal for each of the light-emitting elements.

7. The light-emitting panel according to claim 6, wherein the power driver chip is disposed in a central region of the light-emitting panel; or the light-emitting region comprises a plurality of light-emitting subregions, the driver chips comprise a plurality of power driver chips, and each of the plurality of power driver chips is disposed in a central region of a respective one of the plurality of light-emitting subregions.

8. The light-emitting panel according to claim 1, further comprising a signal transmission portion, wherein the signal transmission portion is disposed on the first surface and electrically connected to each of the light-emitting elements;

the light-emitting panel further comprises a connection portion, wherein the connection portion comprises first connection portions and a second connection portion connected to each of the first connection portions, the first connection portions each are disposed in a respective one of the first connection vias, and the second connection portion is disposed on the second surface; and the first connection portions each are electrically connected to the signal transmission portion, and the second connection portion is electrically connected to the at least one of the driver chips.

9. The light-emitting panel according to claim 8, wherein the second connection portion is in contact with and electrically connected to the at least one of the driver chips.

10. The light-emitting panel according to claim 8, wherein the light-emitting panel further comprises a pad structure, wherein the pad structure comprises a plurality of pads, and at least one of the plurality of pads is electrically connected to the second connection portion and the at least one of the driver chips respectively.

11. The light-emitting panel according to claim 10, wherein the plurality of pads comprise connection pads and dummy pads;

at least one of the connection pads is electrically connected to the second connection portion and the at least one of the driver chips respectively; and one of the dummy pads is disposed between adjacent two connection pads of the connection pads.

12. The light-emitting panel according to claim 1, wherein at least one of the driver chips is electrically connected to more than one of the light-emitting elements respectively through more than one of the first connection vias.

13. The light-emitting panel according to claim 1, wherein the light-emitting elements comprise micro light-emitting diodes or mini light-emitting diodes.

14. A display device, comprising a light-emitting panel, wherein the light-emitting panel comprises:

a substrate comprising a first surface and a second surface disposed opposite to each other;

light-emitting elements and driver chips, wherein the light-emitting elements are disposed on the first surface, and at least one of the driver chips is disposed on the second surface; and first connection vias penetrating through the substrate, wherein the at least one of the driver chips is electrically connected to a respective one of the light-emitting elements through a respective one of the first connection vias;

wherein the light-emitting panel further comprises a light-emitting region, the light-emitting region comprises a plurality of light-emitting subregions, each of the plurality of light-emitting subregions comprises at least one of the light-emitting elements; the driver chips comprise a main driver chip and a plurality of driver subchips, the main driver chip is connected to each driver subchip of the plurality of driver subchips to transmit a control signal, the each driver subchip is electrically connected to the at least one light-emitting element in at least one of the plurality of light-emitting subregions through a respective one of the first connection vias to transmit a drive signal, and the at least one of the light-emitting elements in a same light-emitting subregion are driven by a same driver subchip; and wherein the main driver chip is disposed on the first surface; and the light-emitting panel further comprises second connection vias penetrating through the substrate, and the main driver chip is electrically connected to each of the plurality of driver subchips through a respective one of the second connection vias.

15. A backlight module, comprising a light-emitting panel and an optical structure disposed at a light exiting side of the light-emitting panel, wherein the light-emitting panel comprises:

a substrate comprising a first surface and a second surface disposed opposite to each other;

light-emitting elements and driver chips, wherein the light-emitting elements are disposed on the first surface, and at least one of the driver chips is disposed on the second surface; and first connection vias penetrating through the substrate, wherein the at least one of the driver chips is electrically connected to a respective one of the light-emitting elements through a respective one of the first connection vias;

wherein the light-emitting panel further comprises a light-emitting region, the light-emitting region comprises a plurality of light-emitting subregions, each of the plurality of light-emitting subregions comprises at least one of the light-emitting elements; the driver chips comprise a main driver chip and a plurality of driver subchips, the main driver chip is connected to each driver subchip of the plurality of driver subchips to transmit a control signal, the each driver subchip is electrically connected to the at least one light-emitting element in at least one of the plurality of light-emitting subregions through a respective one of the first connection vias to transmit a drive signal, and the at least one of the light-emitting elements in a same light-emitting subregion are driven by a same driver subchip; and wherein the main driver chip is disposed on the first surface; and the light-emitting panel further comprises second connection vias penetrating through the substrate, and the main driver chip is electrically connected to each of the plurality of driver subchips through a respective one of the second connection vias.

16. A display device, comprising the backlight module according to claim 15.

* * * * *